(12) United States Patent
Oh et al.

(10) Patent No.: US 12,406,934 B2
(45) Date of Patent: Sep. 2, 2025

(54) SEMICONDUCTOR PACKAGE

(71) Applicant: SAMSUNG ELECTRONICS CO., LTD., Suwon-si (KR)

(72) Inventors: Juhyeon Oh, Asan-si (KR); Sunchul Kim, Hwaseong-si (KR); Hyunki Kim, Asan-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 476 days.

(21) Appl. No.: 17/887,557

(22) Filed: Aug. 15, 2022

(65) Prior Publication Data

US 2022/0392846 A1 Dec. 8, 2022

Related U.S. Application Data

(63) Continuation of application No. 17/032,916, filed on Sep. 25, 2020, now Pat. No. 11,437,326, which is a
(Continued)

(30) Foreign Application Priority Data

Aug. 1, 2018 (KR) .................. 10-2018-0089681
Nov. 14, 2018 (KR) .................. 10-2018-0139720

(51) Int. Cl.
*H01L 23/538* (2006.01)
*H01L 23/00* (2006.01)
(Continued)

(52) U.S. Cl.
CPC ......... *H01L 23/5386* (2013.01); *H01L 23/16* (2013.01); *H01L 23/3128* (2013.01);
(Continued)

(58) Field of Classification Search
CPC . H01L 23/5386; H01L 23/16; H01L 23/3128; H01L 23/5385; H01L 23/5389;
(Continued)

(56) References Cited

U.S. PATENT DOCUMENTS 7,217,993 B2  5/2007  Nishimura
7,901,987 B2  3/2011  Yang et al.
(Continued)

FOREIGN PATENT DOCUMENTS

CN  102163591 A  8/2011
CN  103219299 A  7/2013
(Continued)

OTHER PUBLICATIONS

Notice of Allowance issued Jul. 14, 2020 in U.S. Appl. No. 16/424,000.
(Continued)

*Primary Examiner* — Fernando L Toledo
*Assistant Examiner* — Neil R Prasad
(74) *Attorney, Agent, or Firm* — Sughrue Mion, PLLC

(57) ABSTRACT

A semiconductor package includes a first substrate, a second substrate provided on the first substrate, a semiconductor chip provided between the first substrate and the second substrate, solder structures extending between the first substrate and the second substrate and spaced apart from the semiconductor chip, and bumps provided between the semiconductor chip and the second substrate. The solder structures electrically connect the first substrate and the second substrate.

20 Claims, 37 Drawing Sheets

Related U.S. Application Data continuation of application No. 16/424,000, filed on May 28, 2019, now Pat. No. 10,825,774.

(51) Int. Cl.
  *H01L 23/16* (2006.01)
  *H01L 23/31* (2006.01)
  *H01L 21/52* (2006.01)
  *H01L 25/18* (2023.01)

(52) U.S. Cl.
  CPC ...... *H01L 23/5385* (2013.01); *H01L 23/5389* (2013.01); *H01L 24/16* (2013.01); *H01L 21/52* (2013.01); *H01L 25/18* (2013.01); *H01L 2224/16227* (2013.01)

(58) Field of Classification Search
  CPC ......... H01L 24/16; H01L 21/52; H01L 25/18; H01L 2224/16227
  See application file for complete search history.

(56) References Cited

U.S. PATENT DOCUMENTS

| | | | |
|---|---|---|---|
| 7,989,707 B2 | 8/2011 | Yamano et al. |
| 8,035,210 B2 | 10/2011 | Yang et al. |
| 8,587,108 B2 | 11/2013 | Youn et al. |
| 8,653,640 B2 | 2/2014 | Kim et al. |
| 8,779,570 B2 | 7/2014 | Shim et al. |
| 9,111,896 B2 | 8/2015 | Yu et al. |
| 9,305,855 B2 | 4/2016 | Kim |
| 9,324,626 B2 | 4/2016 | Shen et al. |
| 9,324,657 B2 | 4/2016 | Seo et al. |
| 9,343,535 B2 | 5/2016 | Lee et al. |
| 9,478,523 B2 | 10/2016 | Lee |
| 9,786,635 B2 | 10/2017 | Chen |
| 9,793,187 B2 | 10/2017 | Lin et al. |
| 9,947,642 B2 | 4/2018 | Kumar et al. |
| 9,966,321 B2 | 5/2018 | Lu et al. |
| 10,163,865 B2 | 12/2018 | Chen |
| 10,186,503 B2 | 1/2019 | Kitazume et al. |
| 10,192,804 B2 | 1/2019 | Chen et al. |
| 10,461,059 B2 | 10/2019 | Koopmans et al. |
| 10,665,579 B2 | 5/2020 | Trimberger et al. |
| 2014/0346667 A1* | 11/2014 | Han ........................ H01L 25/50 257/737 |
| 2015/0115466 A1* | 4/2015 | Kim .................... H01L 23/3121 257/774 |
| 2016/0027764 A1* | 1/2016 | Kim ...................... H01L 25/105 257/686 |
| 2016/0093572 A1 | 3/2016 | Chen |
| 2016/0141270 A1* | 5/2016 | Koopmans ............. H01L 25/50 438/109 |
| 2017/0098633 A1* | 4/2017 | Kumar ................ H01L 23/3114 |
| 2018/0026014 A1 | 1/2018 | Yew et al. |
| 2018/0061816 A1 | 3/2018 | Kim |
| 2018/0068870 A1 | 3/2018 | Tsai et al. |
| 2019/0019758 A1 | 1/2019 | Kim et al. |

FOREIGN PATENT DOCUMENTS

| | | |
|---|---|---|
| CN | 104576557 A | 4/2015 |
| JP | 2002026048 A | 1/2002 |
| JP | 2009-054684 A | 3/2009 |
| KR | 1020120033029 A | 4/2012 |
| KR | 10-1261482 B1 | 5/2013 |
| KR | 10-1476774 B1 | 12/2014 |
| KR | 1020160113201 A | 9/2016 |
| KR | 1020180064402 A | 6/2018 |
| KR | 10-2019-0008723 A | 1/2019 |
| WO | 2017059141 A1 | 4/2017 |

OTHER PUBLICATIONS

Notice of Allowance issued May 2, 2022 in U.S. Appl. No. 17/032,916.

Office Action issued Feb. 14, 2022 in U.S. Appl. No. 17/032,916.

* cited by examiner

SEMICONDUCTOR PACKAGE

CROSS-REFERENCE TO RELATED APPLICATIONS

This application is a continuation of U.S. application Ser. No. 17/032,916 filed on Sep. 25, 2020, which is a continuation of U.S. application Ser. No. 16/424,000 filed on May 28, 2019, now U.S. Pat. No. 10,825,774, which claims priority under 35 U.S.C. § 119 to Korean Patent Application No. 10-2018-0089681, filed on Aug. 1, 2018, and Korean Patent Application No. 10-2018-0139720, filed on Nov. 14, 2018, in the Korean Intellectual Property Office, the entire contents of which are hereby incorporated by reference.

BACKGROUND

The present disclosure relates to a semiconductor package, and in particular, to a stack-type semiconductor package.

In the case where an integrated circuit (IC) chip is provided in the form of a semiconductor package, it can be easily used as a part of an electronic product. In general, the semiconductor package includes a printed circuit board (PCB) and a semiconductor chip, which is mounted on the PCB and is electrically connected to the PCB by bonding wires or bumps. With development of the semiconductor industry, many studies are being conducted to improve reliability of the semiconductor package.

SUMMARY

One or more example embodiments provide a semiconductor package having a minimized number of defects and improved reliability and a method of fabricating the same.

According to an aspect of an example embodiment, a semiconductor package may include a first substrate, a second substrate provided on the first substrate, a semiconductor chip provided between the first substrate and the second substrate, solder structures extending between the first substrate and the second substrate and spaced apart from the semiconductor chip, the solder structures electrically connecting the first substrate and the second substrate, and bumps provided between the semiconductor chip and the second substrate.

According to an aspect of an example embodiment, a semiconductor package may include a first substrate, a second substrate provided on the first substrate, a first semiconductor chip provided between the first substrate and the second substrate, solder structures provided between the first substrate and the second substrate and spaced apart from the first semiconductor chip, the solder structures electrically connecting the first substrate and the second substrate, and supporting patterns provided between the first substrate and the second substrate and spaced apart from the first semiconductor chip, wherein the solder structures are disposed between the first semiconductor chip and the supporting patterns, and the supporting patterns enclose sides of the first semiconductor chip.

According to an aspect of an example embodiment, a semiconductor package may include a first substrate, a second substrate provided on the first substrate, a semiconductor chip provided between the first substrate and the second substrate, bumps provided between the semiconductor chip and the second substrate and supporting the second substrate to be spaced apart from the semiconductor chip, and solder structures extending between the first substrate and the second substrate and spaced apart from the semiconductor chip, wherein each of the solder structures includes a lower solder ball provided on an upper surface of the first substrate, and an upper solder ball provided on a lower surface of the second substrate and reflow joined to the lower solder ball

BRIEF DESCRIPTION OF THE DRAWINGS

Example embodiments will be more clearly understood from the following detailed description taken in conjunction with the accompanying drawings in which.

DETAILED DESCRIPTION

Example embodiments will now be described more fully with reference to the accompanying drawings.

It should be noted that the drawings are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of layers, regions and/or structural elements may be reduced or exaggerated for clarity. The use of similar or identical reference numbers in the various drawings is intended to indicate the presence of a similar or identical element or feature.

Figure 1:
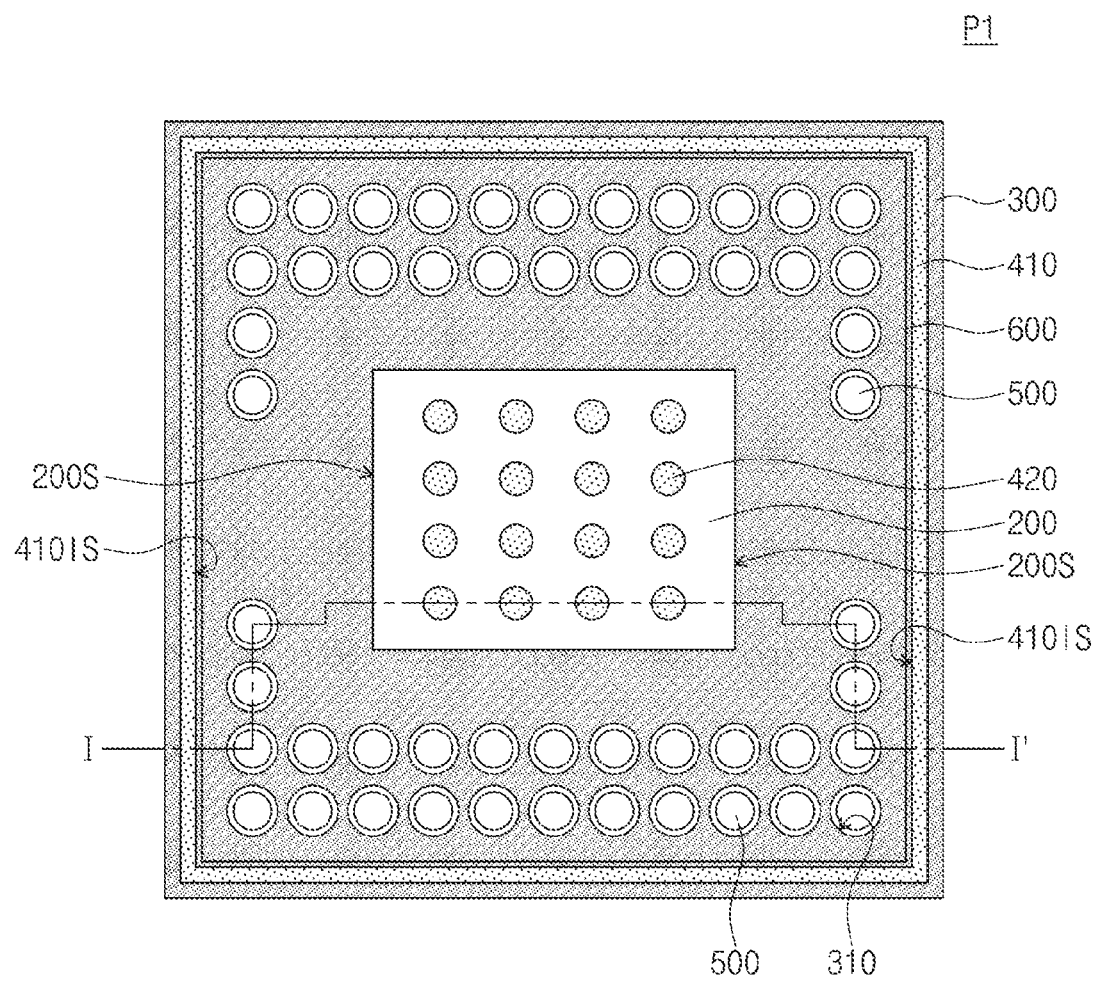
FIG. 1 is a plan view illustrating a first semiconductor package according to an example embodiment.
Figure 2:
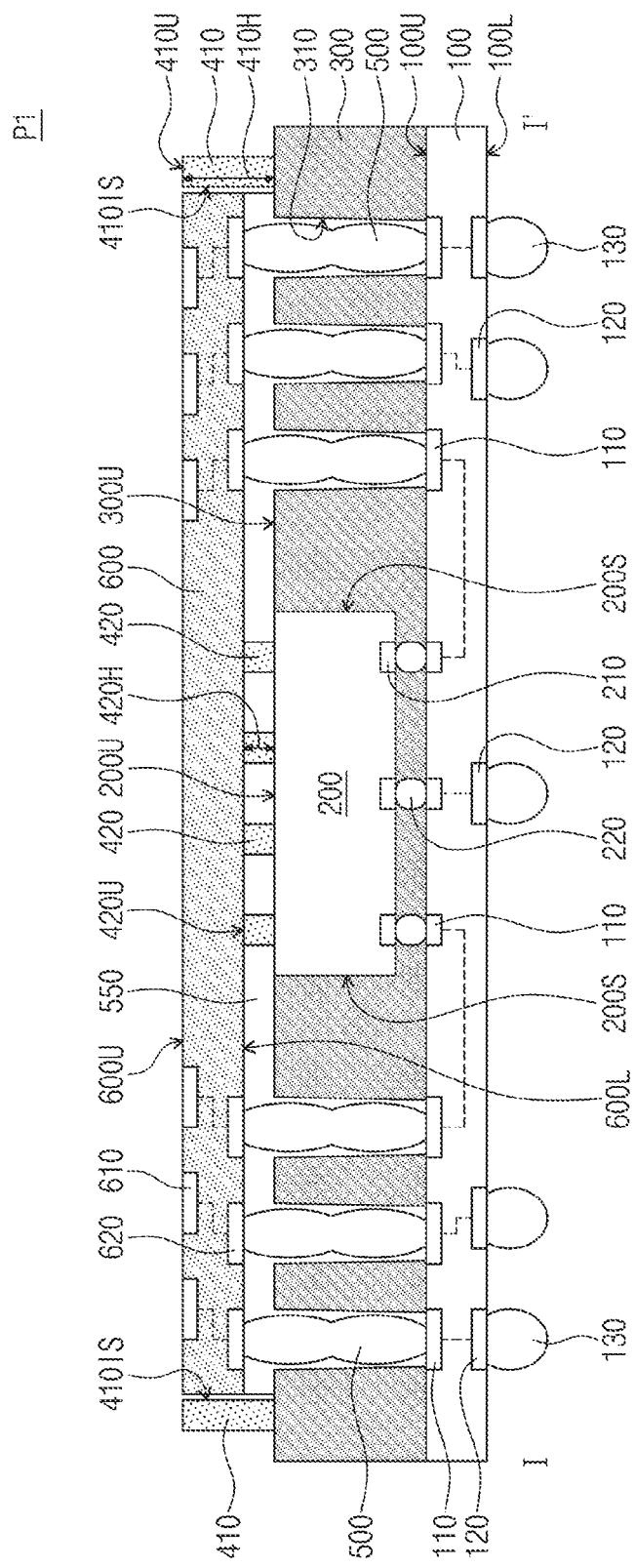
FIG. 2 is a sectional view taken along a line I-I' of FIG. 1.

FIG. 1 is a plan view illustrating a first semiconductor package P1 according to an example embodiment. FIG. 2 is a sectional view taken along a line I-I' of FIG. 1.

Referring to FIGS. 1 and 2, a first semiconductor chip 200 and a first mold layer 300 may be provided on a first substrate 100. The first substrate 100 may be a printed circuit board with a circuit pattern or a redistribution layer. The first substrate 100 may include first substrate pads 110 and second substrate pads 120. The first substrate pads 110 and the second substrate pads 120 may be respectively provided on an upper surface 100U and a lower surface 100L of the first substrate 100. The second substrate pads 120 may be connected to corresponding pads of the first substrate pads 110 through internal interconnection lines. In the following diagrams, the internal interconnection line in the first substrate 100 will be schematically illustrated by a dotted line. The first substrate pads 110 and the second substrate pads 120 may be formed of or include at least one of conductive materials. Outer terminals 130 may be provided on the lower surface 100L of the first substrate 100 and may be connected to the second substrate pads 120. The outer terminal 130 may be formed of or include at least one of conductive material and may be provided in the form of a solder ball.

The first semiconductor chip 200 may include chip pads 210 provided on a lower surface thereof. Connecting portions 220 may be provided between the first substrate 100 and the first semiconductor chip 200 and may be connected to the chip pads 210, respectively. The connecting portions 220 may be connected to corresponding pads of the first substrate pads 110. The first semiconductor chip 200 may be electrically connected to the first substrate 100 through the connecting portions 220. The chip pads 210 and the connecting portions 220 may be formed of or include at least one of conductive materials. Each of the connecting portions 220 may include one of solder balls, bumps, or pillars. The first semiconductor chip 200 may include integrated circuits and, in an example embodiment, the integrated circuits may be adjacent to the lower surface of the first semiconductor chip 200. The first semiconductor chip 200 may be a logic chip. As an example, the first semiconductor chip 200 may be a non-memory chip (e.g., an application processor).

The first mold layer 300 may cover the upper surface 100U of the first substrate 100 and a side surface 200S of the first semiconductor chip 200. The first mold layer 300 may be provided to fill a gap region between the first substrate 100 and the first semiconductor chip 200 and to seal the connecting portions 220. The first mold layer 300 may be provided to expose an upper surface 200U of the first semiconductor chip 200. An upper surface 300U of the first mold layer 300 may be located at substantially the same height as the upper surface 200U of the first semiconductor chip 200. In the present specification, the term "height" will be used to refer to a distance measured from the upper surface 100U of the first substrate 100. The first mold layer 300 may include at least one of epoxy molding compounds.

The first mold layer 300 may include openings 310. Each of the openings 310 may penetrate through the first mold layer 300 and expose a corresponding one of the first substrate pads 110. The openings 310 may be horizontally spaced apart from the first semiconductor chip 200. In other words, the openings 310 may be spaced apart from the first semiconductor chip 200 in a direction parallel to the upper surface 100U of the first substrate 100. Solder structures 500 may be provided in the openings 310, respectively. The solder structures 500 may be connected to corresponding pads of the first substrate pads 110. Each of the solder structures 500 may be electrically connected to the outer terminal 130 or the first semiconductor chip 200. The solder structures 500 may be formed of or include at least one of conductive materials (e.g., tin, lead, silver, or alloys thereof).

A plurality of bumps 420 may be provided on the upper surface 200U of the first semiconductor chip 200. The bumps 420 may be horizontally spaced apart from each other. For example, the bumps 420 may be spaced apart from each other in a direction parallel to the upper surface 100U of the first substrate 100. The bumps 420 may be two-dimensionally arranged in two different directions parallel to the upper surface 100U of the first substrate 100, but embodiments are not limited to this example. Each of the bumps 420 may have a pillar shape and protrude from the upper surface 200U of the first semiconductor chip 200. Each of the bumps 420 may have a length 420H, when measured in a direction perpendicular to the upper surface 100U of the first substrate 100. In some example embodiments, the bumps 420 may be formed of or include a material different from the first mold layer 300. As an example, the bumps 420 may include at least one of insulating polymer materials, conductive polymer materials, or solder resist materials. In certain example embodiments, the bumps 420 may be formed of or include the same material as the first mold layer 300.

A guide pattern 410 may be provided on the first substrate 100 and may be horizontally spaced apart from the first semiconductor chip 200. For example, the guide pattern 410 may be spaced apart from the first semiconductor chip 200 in a direction parallel to the upper surface 100U of the first substrate 100. In some example embodiments, the guide pattern 410 may be provided on the upper surface 300U of the first mold layer 300. When viewed in a plan view, the guide pattern 410 may be provided to enclose the side surface 200S of the first semiconductor chip 200 and the solder structures 500 may be provided between the first semiconductor chip 200 and the guide pattern 410. As an example, the guide pattern 410 may be extended along the side surface 200S of the first semiconductor chip 200 and may have a polygonal shape, when viewed in a plan view.

Some modified examples of the planar shape of the guide pattern 410 will be described in more detail with reference to FIGS. 3A to 3D.

The guide pattern 410 may protrude from the upper surface 300U of the first mold layer 300. The guide pattern 410 may have a length 410H in the direction perpendicular to the upper surface 100U of the first substrate 100. The length 410H of the guide pattern 410 may be greater than the length 420H of each of the bumps 420. An upper surface 410U of the guide pattern 410 may be positioned at a height than higher a height of the upper surfaces 420U of the bumps 420. In some example embodiments, the guide pattern 410 may be formed of or include a material different from the first mold layer 300. As an example, the guide pattern 410 may include at least one of insulating polymer materials, conductive polymer materials, or solder resist materials. In certain example embodiments, the guide pattern 410 may be formed of or include the same material as the first mold layer 300. The guide pattern 410 may be formed of or include the same material as the bumps 420.

A second substrate 600 may be provided on the first semiconductor chip 200 and the first mold layer 300. In some example embodiments, the second substrate 600 may include an interposer substrate. In this case, the second substrate 600 may be formed of or include at least one of insulating resins. As an example, the insulating resin may include a solder resist material (e.g., photosensitive polyimide), but embodiments are not limited to this example. First pads 610 and second pads 620 may be respectively provided on an upper surface 600U and a lower surface 600L of the second substrate 600. Interconnection lines may be provided in the second substrate 600 to electrically connect the first pads 610 and the second pads 620 to each other. In FIG. 2, the interconnection lines are schematically illustrated by the dotted line in the second substrate 600. The first pads 610 and the second pads 620 may be formed of or include at least one of conductive or metallic materials (e.g., copper or aluminum). The solder structures 500 may be connected to the second pads 620. The second substrate 600 may be electrically connected to the first substrate 100 and the first semiconductor chip 200 through the solder structures 500.

The bumps 420 may be interposed between the first semiconductor chip 200 and the second substrate 600. The bumps 420 may be in contact with the upper surface 200U of the first semiconductor chip 200 and the lower surface 600L of the second substrate 600. The guide pattern 410 may have inner side surfaces 410IS, which are provided to face each other with the bumps 420 interposed therebetween. The second substrate 600 may be provided between the inner side surfaces 410IS of the guide pattern 410. When viewed in a plan view, the guide pattern 410 may be provided to enclose a side surface of the second substrate 600. The upper surface 410U of the guide pattern 410 may be located at a height higher than the lower surface 600L of the second substrate 600.

An under-fill layer 550 may be interposed between the second substrate 600 and the first semiconductor chip 200 and between the second substrate 600 and the first mold layer 300. The under-fill layer 550 may be extended into the openings 310 in the first mold layer 300 to cover the solder structures 500. The under-fill layer 550 may be interposed between the bumps 420 and may be locally provided between the inner side surfaces 410IS of the guide pattern 410. The under-fill layer 550 may be formed of or include a material different from the first mold layer 300. As an example, the under-fill layer 550 may be formed of or include an insulating resin. In some example embodiments, the under-fill layer 550 may be omitted.

FIGS. 3A to 3D are plan views illustrating some modified structures of the guide pattern 410 of FIG. 1. To avoid complexity of the drawings, the solder structures 500 and the openings 310 are not illustrated in FIGS. 3A to 3D.

Figure 3A:
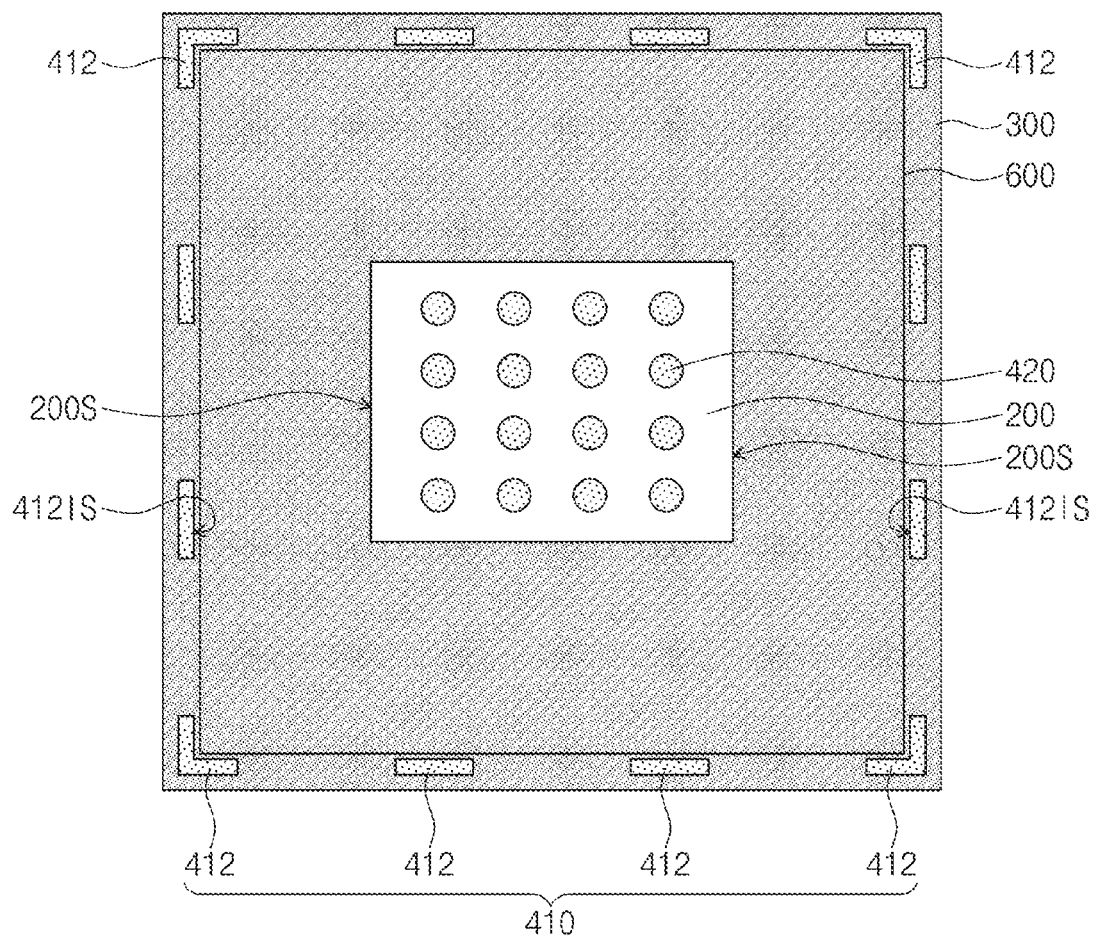
FIGS. 3A to 3D are plan views illustrating some modified structures of a guide pattern of FIG. 1.
Figure 3B:
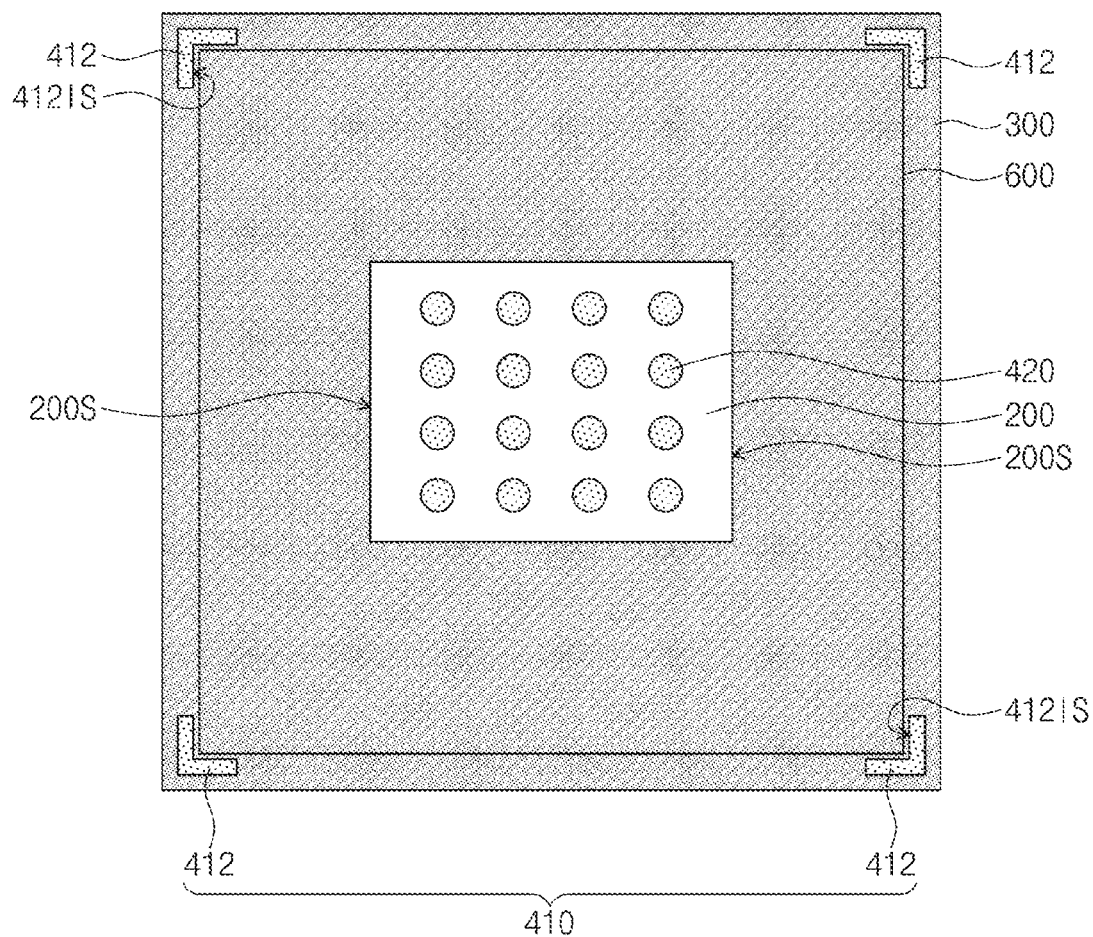

Referring to FIGS. 2, 3A, and 3B, the guide pattern 410 may include a plurality of segments 412 spaced apart from each other. The segments 412 may be provided on the upper surface 300U of the first mold layer 300 and may be horizontally spaced apart from each other. The segments 412 may be provided to enclose the side surface 200S of the first semiconductor chip 200, when viewed in a plan view. The segments 412 may be arranged to be spaced apart from each other along the side surface 200S of the first semiconductor chip 200. The segments 412 may have inner side surfaces 412IS facing each other with the bumps 420 interposed therebetween. The inner side surfaces 412IS of the segments 412 may correspond to the inner side surfaces 410IS of the guide pattern 410 shown in FIG. 2. The second substrate 600 may be disposed between the inner side surfaces 412IS of the segments 412. When viewed in a plan view, the segments 412 may be provided to enclose a side surface of the second substrate 600. As an example, as shown in FIG. 3A, the segments 412 may be provided to cover portions of the side surface of the second substrate 600 and corners of the second substrate 600. As another example, as shown in FIG. 3B, the segments 412 may be provided to cover only the corners of the second substrate 600.

Figure 3C:
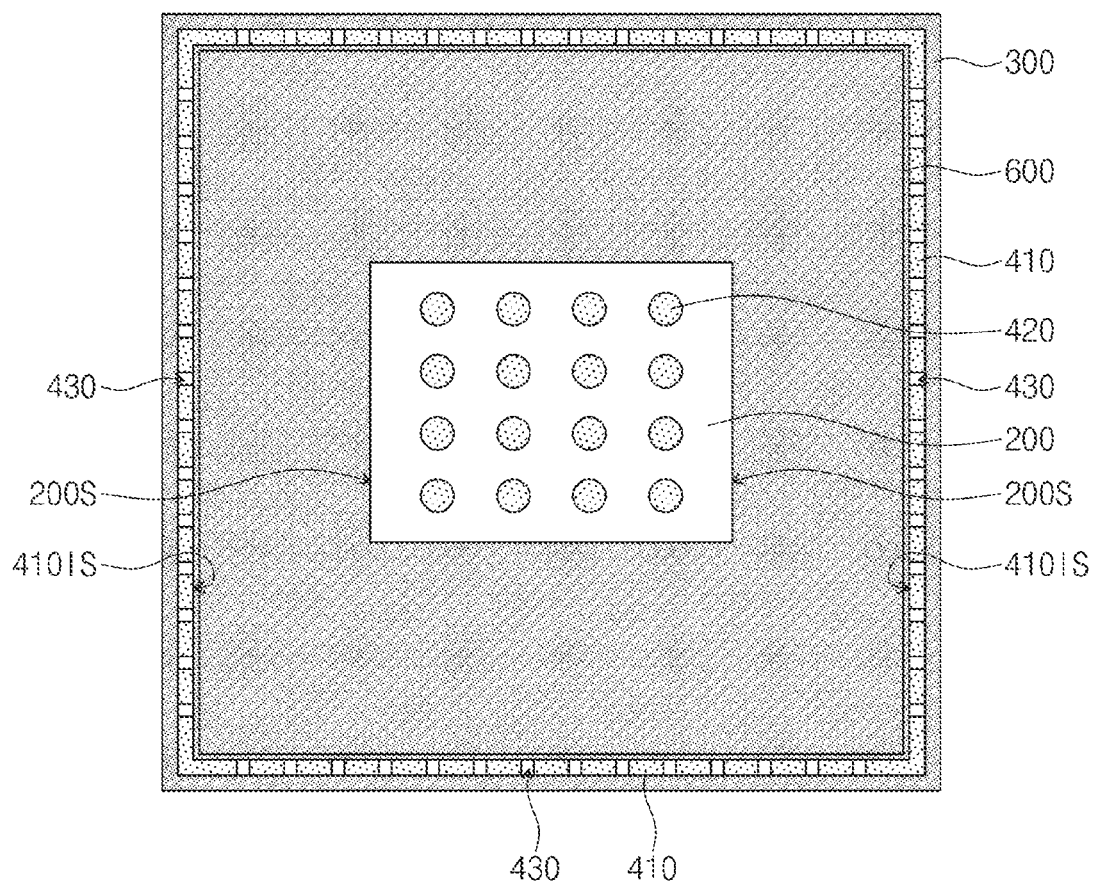

Referring to FIGS. 2 and 3C, a plurality of holes 430 may be provided in the guide pattern 410. Each of the holes 430 may penetrate at least a portion of the guide pattern 410. The holes 430 may be spaced apart from each other along the side surface 200S of the first semiconductor chip 200, when viewed in a plan view. The holes 430 may be arranged to enclose the side surface of the second substrate 600, when viewed in a plan view.

Figure 3D:
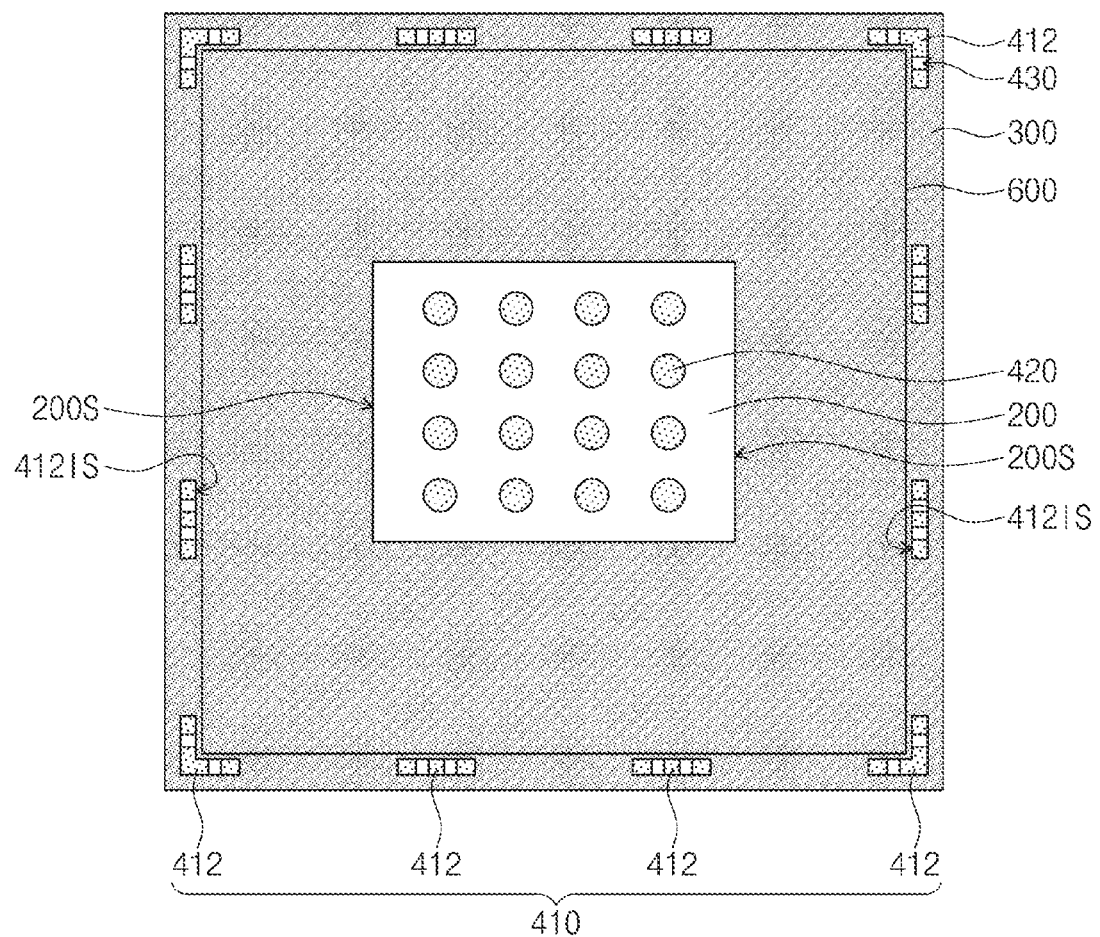

Referring to FIGS. 2 and 3D, the guide pattern 410 may include the segments 412, and the segments 412 may be provided to cover a portion of the side surface of the second substrate 600 and corners of the second substrate 600. At least one hole 430 may be provided in each of the segments 412. The at least one hole 430 may penetrate at least a portion of each of the segments 412. Except for the aforedescribed differences, the guide patterns 410 according to the modified example embodiments may be substantially the same as the guide pattern 410 described with reference to FIGS. 1 and 2.

Figure 4:
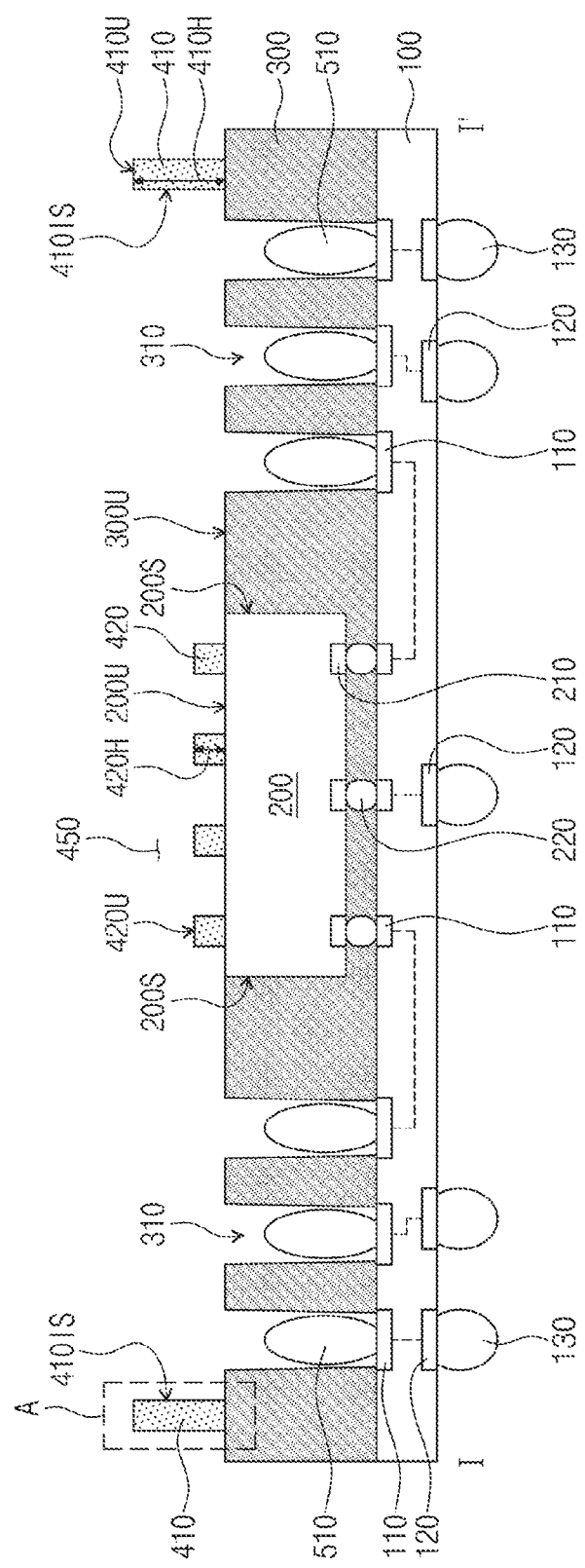
FIGS. 4 and 5 are sectional views illustrating a method of fabricating a first semiconductor package according to an example embodiment, taken along a line corresponding to the line I-I' of FIG. 1.
Figure 5:
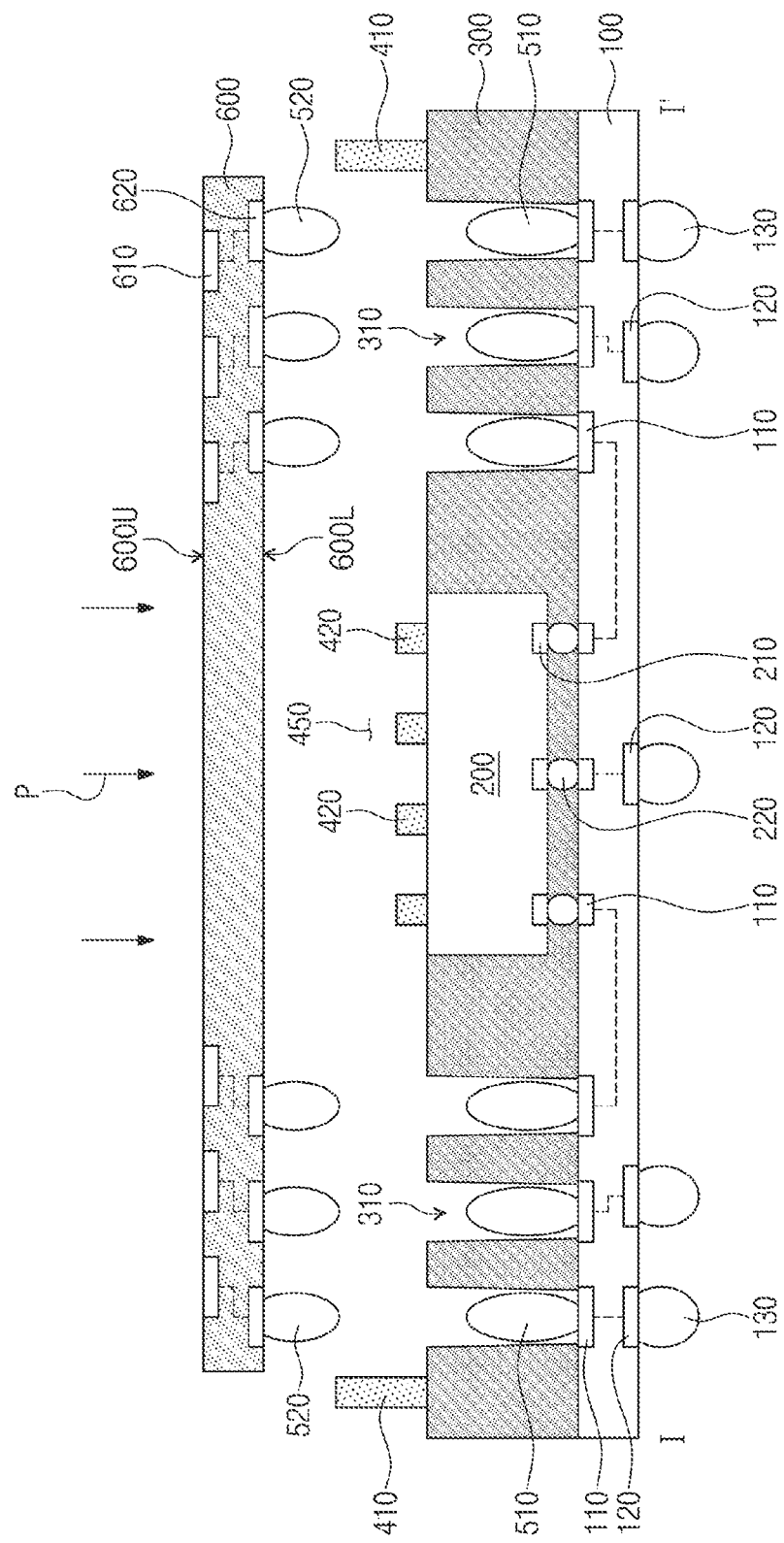
Figure 6:
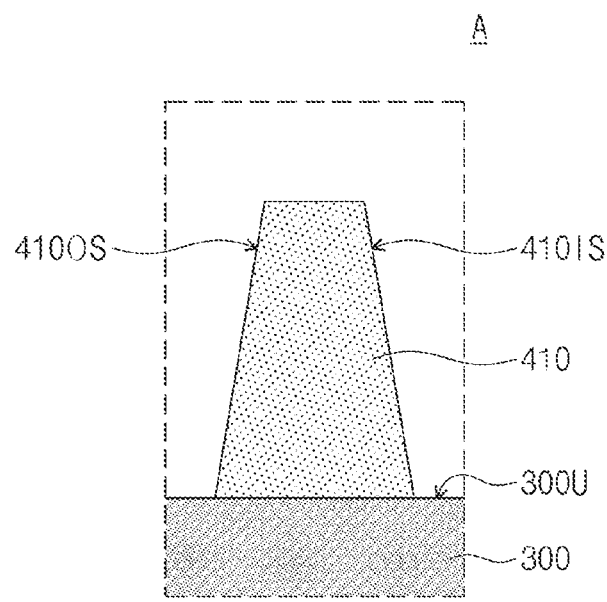
FIG. 6 is an enlarged view of a portion 'A' of FIG. 4.

FIGS. 4 and 5 are sectional views illustrating a method of fabricating the first semiconductor package P1 according to an example embodiment, taken along a line corresponding to the line I-I' of FIG. 1. FIG. 6 is an enlarged view of a portion 'A' of FIG. 4. In order to avoid redundancy, overlapping description of the first semiconductor package P1 described with reference to FIGS. 1, 2 and 3A to 3D may be omitted.

Referring to FIGS. 1 and 4, the first semiconductor chip 200 may be mounted on the first substrate 100. The first mold layer 300 may be formed on the first substrate 100 to cover the side surface 200S of the first semiconductor chip 200. The first mold layer 300 may be provided to expose an upper surface 200U of the first semiconductor chip 200. The openings 310 may be formed in the first mold layer 300. Each of the openings 310 may penetrate through the first mold layer 300 and expose a corresponding one of the first substrate pads 110. The formation of the openings 310 may include removing a portion of the first mold layer 300 using, for example, a laser drilling process. The openings 310 may be horizontally spaced apart from the first semiconductor chip 200. Lower solder balls 510 may be formed in the openings 310, respectively. The lower solder balls 510 may be electrically connected to the outer terminal 130 or the first semiconductor chip 200. The lower solder balls 510 may be formed of or include at least one of conductive materials (e.g., tin, lead, silver, or alloys thereof).

The bumps 420 may be formed on the upper surface 200U of the first semiconductor chip 200, and the guide pattern 410 may be formed on the upper surface 300U of the first mold layer 300. When viewed in a plan view, the guide pattern 410 may enclose the side surface 200S of the first semiconductor chip 200. As an example, the guide pattern 410 may be extended along the side surface 200S of the first semiconductor chip 200 and may have a polygonal shape, when viewed in a plan view. As another example, the guide pattern 410 may have various planar shapes described with reference to FIGS. 3A to 3D. When viewed in a plan view, the lower solder balls 510 may be provided between the first semiconductor chip 200 and the guide pattern 410. In some example embodiments, the bumps 420 and the guide pattern 410 may be formed by an inkjet printing process or a screen printing process. The bumps 420 and the guide pattern 410 may be printed, in desired shapes, on the upper surface 200U of the first semiconductor chip 200 and the upper surface 300U of the first mold layer 300.

Referring to FIGS. 4 and 6, the guide pattern 410 may have the inner side surfaces 410IS, which are disposed to face each other with the bumps 420 interposed therebetween, and outer side surfaces 410OS, each of which is opposite to a corresponding one of the inner side surfaces 410IS. In some example embodiments, the side surfaces 410IS and 410OS of the guide pattern 410 may be perpendicular to the upper surface 300U of the first mold layer 300, as shown in FIG. 4. In certain example embodiments, the side surfaces 410IS and 410OS of the guide pattern 410 may be inclined at an angle relative to the upper surface 300U of the first mold layer 300, as shown in FIG. 6. For example, the guide pattern 410 may be formed in such a way that its upper width is smaller than its lower width.

Referring back to FIGS. 1 and 4, the guide pattern 410 may have a vertical length 410H larger than the vertical length 420H of each of the bumps 420. The upper surface 410U of the guide pattern 410 may be positioned at a height higher than a height of the upper surfaces 420U of the bumps 420. The inner side surfaces 410IS of the guide pattern 410 may define a substrate mounting region 450 on the first semiconductor chip 200 and the first mold layer 300.

Referring to FIGS. 1 and 5, the second substrate 600 may be provided on the first substrate 100. In some example embodiments, the second substrate 600 may be an interposer substrate. The first pads 610 and the second pads 620 may be provided on the upper surface 600U and the lower surface 600L, respectively, of the second substrate 600. The second substrate 600 may be provided in such a way that the lower surface 600L of the second substrate 600 faces the first semiconductor chip 200. Upper solder balls 520 may be provided on the lower surface 600L of the second substrate 600 and may be connected to the second pads 620. The upper solder balls 520 may be formed of or include at least one of conductive materials (e.g., tin, lead, silver, or alloys thereof). The number or arrangement of the upper solder balls 520 may be different from the number or arrangement of the first pads 610. As an example, the upper solder balls 520 may not be overlapped with the first pads 610, when viewed in a plan view. The second substrate 600 may be provided on the first substrate 100 in such a way that the upper solder balls 520 are aligned to the lower solder balls 510, respectively.

The second substrate 600 may be downwardly moved to be placed in the substrate mounting region 450. In this case, pressure P may be exerted on the second substrate 600 to allow the upper solder balls 520 to be in close contact with the lower solder balls 510. For example, a dumbbell may be placed on the second substrate 600 to exert the pressure P on the second substrate 600. In the case where, for close contact between the upper solder balls 520 and the lower solder balls 510, a relatively large pressure P is exerted on the second substrate 600, an electric short circuit may be formed between the upper solder balls 520. According to some example embodiments, the bumps 420 may serve as a motion stop layer to a downward motion of the second substrate 600. The bumps 420 may support the second substrate 600 to allow the second substrate 600 to be uniformly spaced apart from the first semiconductor chip 200 by a specific distance. Accordingly, even when a relatively large pressure is exerted on the second substrate 600, the second substrate 600 may be supported by the bumps 420 and thus, the electric short circuit between the upper solder balls 520 may be prevented. In addition, since the second substrate 600 is placed in the substrate mounting region 450 defined by the guide pattern 410, misalignment between the first substrate 100 and the second substrate 600 may be prevented. As a result, the upper solder balls 520 may be easily aligned and connected to the lower solder balls 510.

Referring back to FIGS. 1 and 2, a reflow process may be performed on the first substrate 100 and the second substrate 600. The reflow process may be performed at a temperature higher than a melting point of the lower and upper solder balls 510 and 520. In this case, the lower and upper solder balls 510 and 520 may be reflowed to form the solder structures 500. The solder structures 500 may be connected to the first substrate pads 110 of the first substrate 100 and the second pads 620 of the second substrate 600. The reflow of the lower and upper solder balls 510 and 520 may lead to an additional downward motion of the second substrate 600. In this case, the guide pattern 410 may prevent the second substrate 600 from being laterally shifted from the first substrate 100. Thus, the solder structures 500 may be easily formed, and the electric short circuit between the solder structures 500 may be prevented.

The under-fill layer 550 may be formed between the second substrate 600 and the first semiconductor chip 200 and between the second substrate 600 and the first mold layer 300. The under-fill layer 550 may be extended into the openings 310 in the first mold layer 300 to cover the solder structures 500. According to some example embodiments, a thickness of a gap between the second substrate 600 and the first semiconductor chip 200 may be constantly maintained by the bumps 420. Thus, the gap regions between the second substrate 600 and the first semiconductor chip 200 and between the second substrate 600 and the first mold layer 300 may be easily filled with the under-fill layer 550. The first semiconductor package P1 may be fabricated by the afore-described method, but embodiments are not limited thereto. For example, in certain example embodiments, the formation of the under-fill layer 550 may be omitted.

Figure 7:
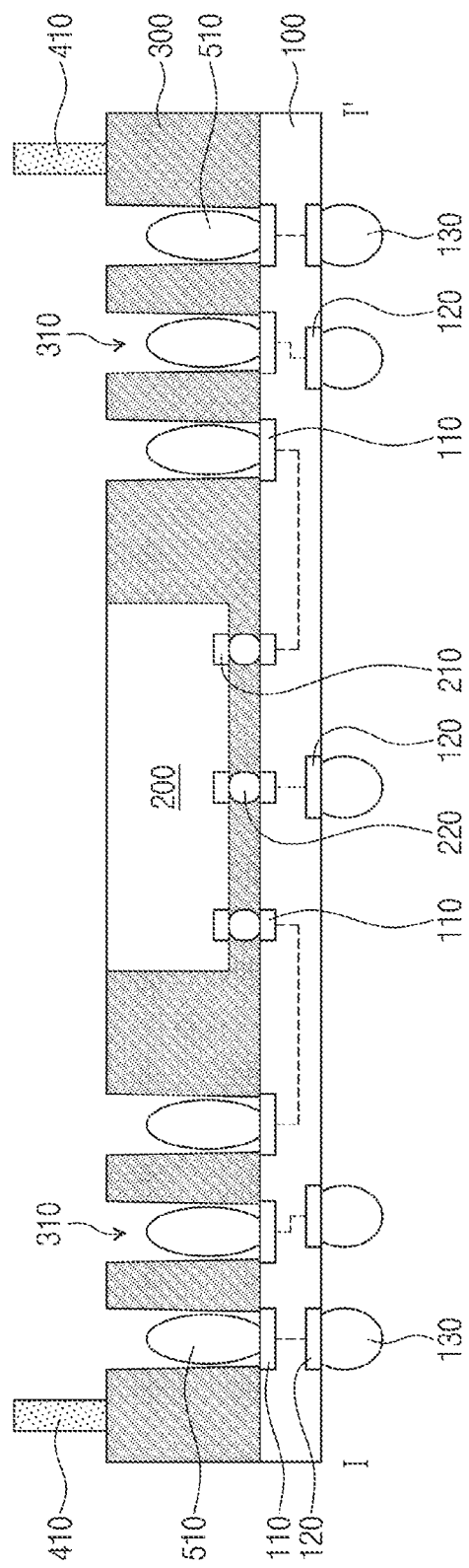
FIGS. 7 and 8 are sectional views illustrating a method of fabricating a first semiconductor package according to an example embodiment, taken along a line corresponding to the line I-I' of FIG. 1.
Figure 8:
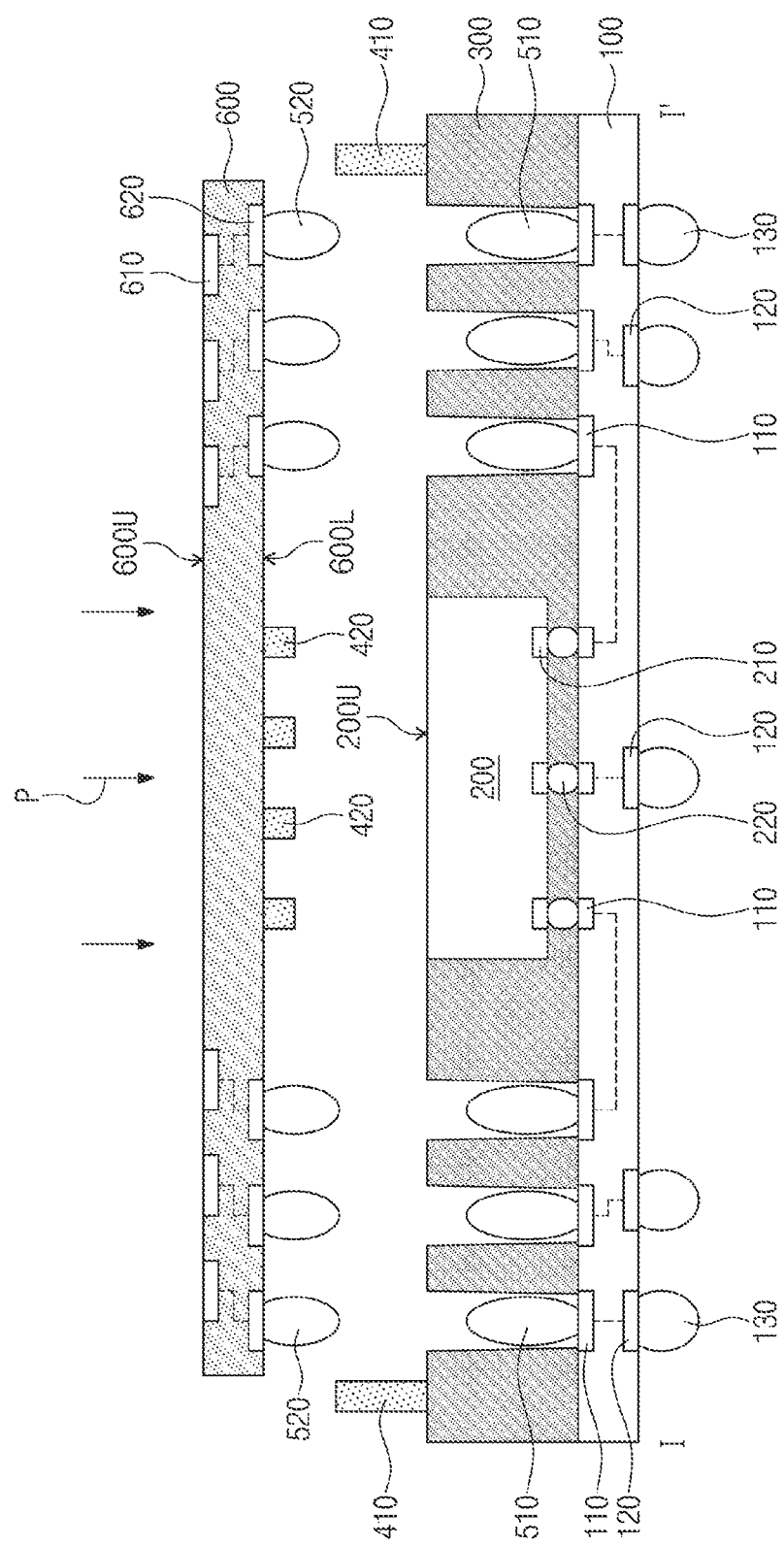

FIGS. 7 and 8 are sectional views illustrating a method of fabricating the first semiconductor package P1 according to an example embodiment, taken along a line corresponding to the line I-I' of FIG. 1. For concise description, the description that follows will mainly refer to features in the fabrication method, which is different from that described with reference to FIGS. 1, 2, 4, 5, and 6.

Referring to FIGS. 7 and 8, according to the present example embodiments, the guide pattern 410 may be formed on the upper surface 300U of the first mold layer 300, and the bumps 420 may be formed on the lower surface 600L of the second substrate 600. The bumps 420 may be formed in a region that is horizontally spaced apart from the upper solder balls 520. The second substrate 600 may be provided in such a way that the lower surface 600L of the second substrate 600 faces the first semiconductor chip 200. The bumps 420 may be provided on the lower surface 600L of the second substrate 600 to face the upper surface 200U of the first semiconductor chip 200. The second substrate 600 may be downwardly moved toward the substrate mounting region 450, and in this case, the bumps 420 may be in contact with the upper surface 200U of the first semiconductor chip 200, as shown in FIG. 2. The bumps 420 may support the second substrate 600 to allow the second substrate 600 to be uniformly spaced apart from the first semiconductor chip 200 by a specific distance.

Figure 9:
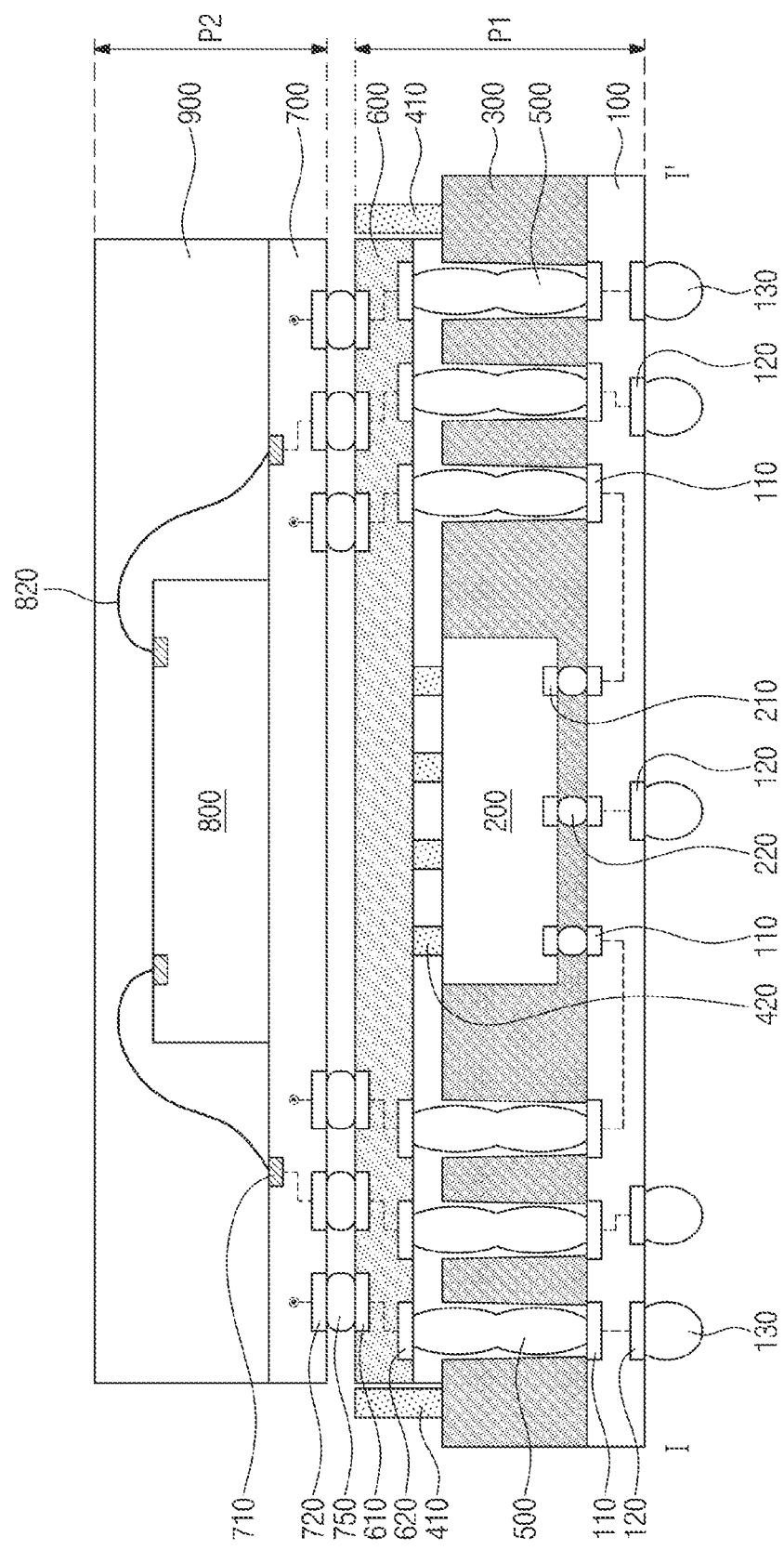
FIG. 9 is a sectional view illustrating a stack-type semiconductor package according to an example embodiment.

FIG. 9 is a sectional view illustrating a stack-type semiconductor package according to an example embodiment.

Referring to FIG. 9, a second semiconductor package P2 may be stacked on the first semiconductor package P1. The first semiconductor package P1 may be substantially the same as the first semiconductor package P1 described with reference to FIGS. 1, 2 and 3A to 3D. The second semiconductor package P2 may include a third substrate 700, a second semiconductor chip 800, and a second mold layer 900. The third substrate 700 may include upper substrate pads 710 and lower substrate pads 720. The upper substrate pads 710 and the lower substrate pads 720 may be provided on an upper surface and a lower surface, respectively, of the third substrate 700. The upper substrate pads 710 and the lower substrate pads 720 may be formed of or include a conductive material. Each of the lower substrate pads 720 may be connected to integrated circuits in the third substrate 700 or a corresponding one of the upper substrate pads 710. In FIG. 9, a dotted line is used to depict an internal interconnection line in the third substrate 700.

As an example, the second semiconductor chip 800 may be electrically connected to the third substrate 700 through a bonding wire 820. As another example, the second semiconductor chip 800 may be mounted on the third substrate 700 in a flip-chip manner. The second semiconductor chip 800 may be configured to perform functions different from those of the first semiconductor chip 200. As an example, the second semiconductor chip 800 may be a memory chip. The second semiconductor chip 800 may be provided in singular or plural, and the integrated circuits in the third substrate 700 may be provided in consideration of a structure or disposition (e.g., mounting structure, kind, size, and/or number) of the second semiconductor chip 800. Connection terminals 750 may be disposed between the second substrate 600 and the third substrate 700 and may be connected to the first pads 610 of the second substrate 600 and the lower substrate pads 720 of the third substrate 700. The second substrate 600 may be an interposer substrate, and in this case, owing to the second substrate 600, the disposition and number of the connection terminals 750 may be independent of the disposition or number of the solder structures 500. The second mold layer 900 may be provided on the third substrate 700 to seal the second semiconductor chip 800.

Figure 10:
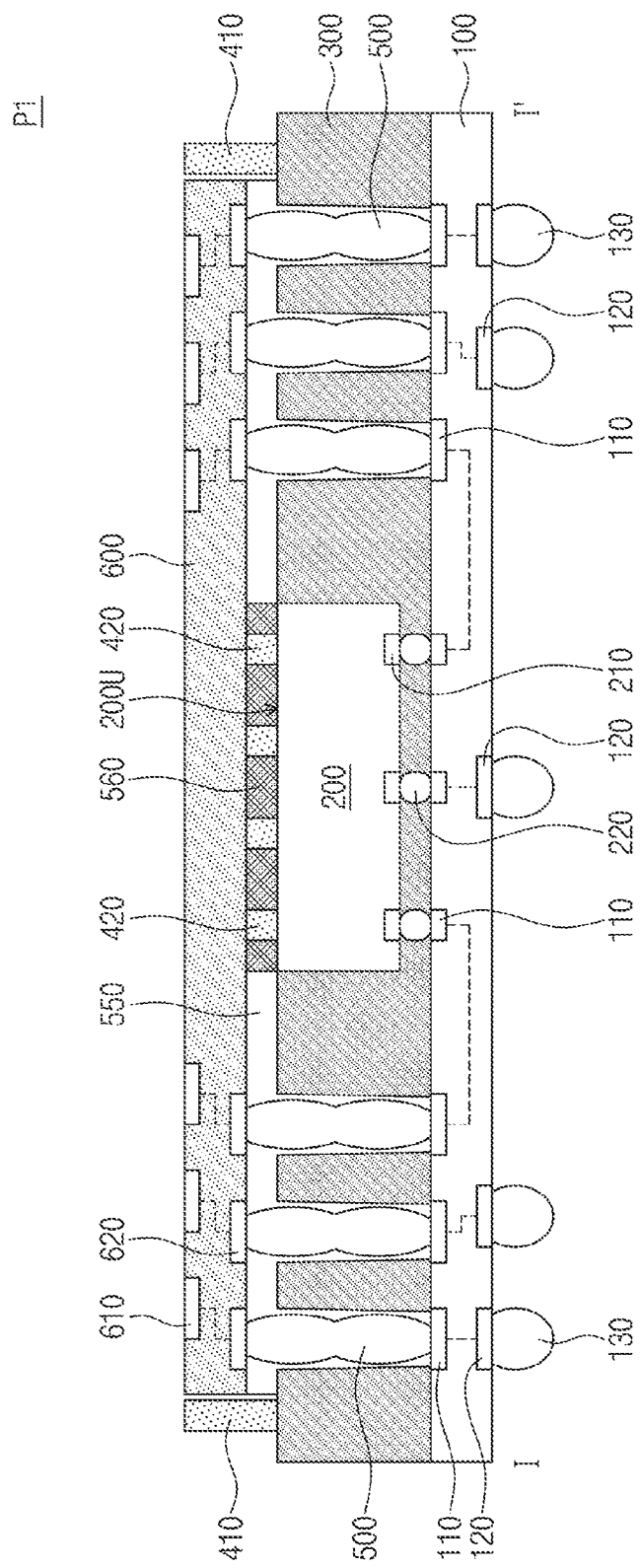
FIG. 10 is a sectional view illustrating a first semiconductor package according to an example embodiment, taken along a line corresponding to the line I-I' of FIG. 1.

FIG. 10 is a sectional view illustrating the first semiconductor package P1 according to an example embodiment, taken along a line corresponding to the line I-I' of FIG. 1. For concise description, the description that follows will mainly refer to features of the first semiconductor package P1 different from that described with reference to FIGS. 1, 2 and 3A to 3D.

Referring to FIGS. 1 and 10, a heat transfer layer 560 may be interposed between the first semiconductor chip 200 and the second substrate 600. The heat transfer layer 560 may cover the upper surface 200U of the first semiconductor chip 200 and may intervene between the bumps 420. The heat transfer layer 560 may be horizontally spaced apart from the solder structures 500. The heat transfer layer 560 may be locally provided on the upper surface 200U of the first semiconductor chip 200. The heat transfer layer 560 may be formed of or include a thermal interface material (TIM). Heat generated from the first semiconductor chip 200 may be easily exhausted to the outside via the heat transfer layer 560. The bumps 420 may be spaced apart from the under-fill layer 550 by the heat transfer layer 560. In some example embodiments, the under-fill layer 550 may be omitted.

Figure 11:
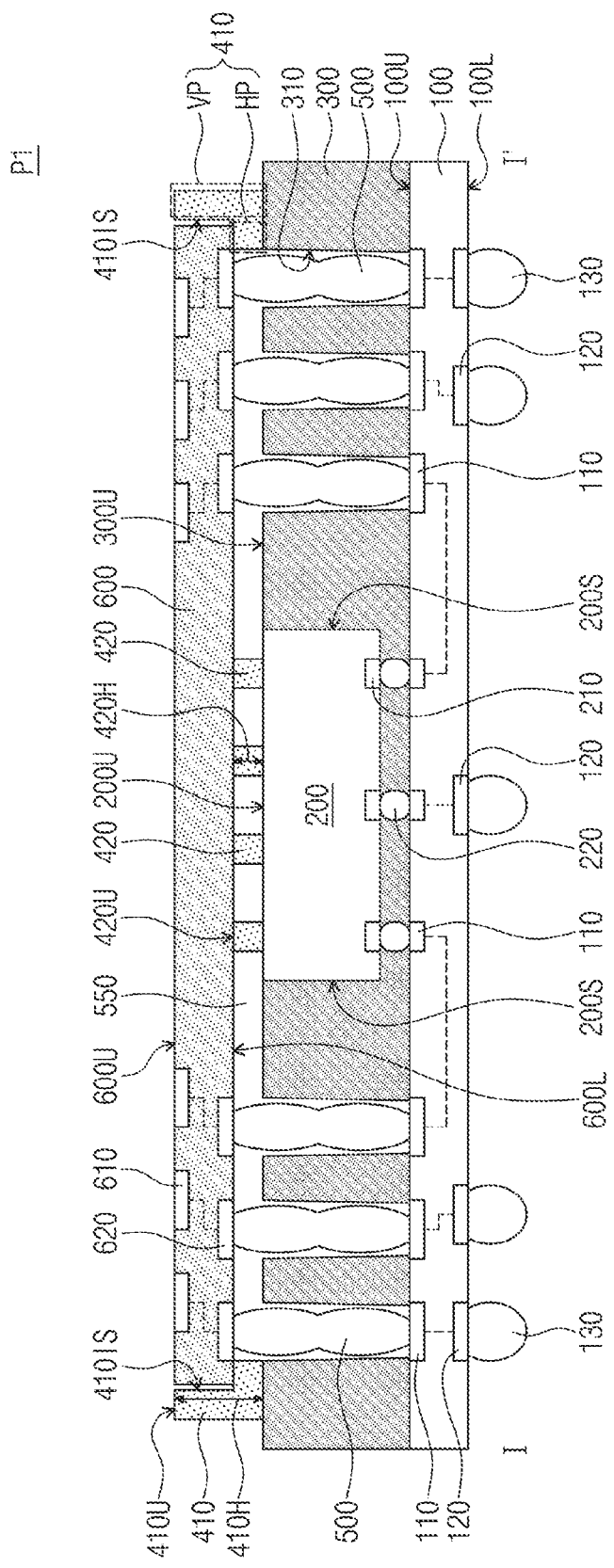
FIG. 11 is a sectional view illustrating a first semiconductor package according to an example embodiment, taken along a line corresponding to the line I-I' of FIG. 1.

FIG. 11 is a sectional view illustrating the first semiconductor package P1 according to an example embodiment, taken along a line corresponding to the line I-I' of FIG. 1. For concise description, the description that follows will mainly refer to features of the first semiconductor package P1 different from that described with reference to FIGS. 1, 2 and 3A to 3D.

Referring to FIGS. 1 and 11, the guide pattern 410 may include a vertical portion VP, which is vertically extended from the upper surface 300U of the first mold layer 300, and a horizontal portion HP, which is extended from the vertical portion to a region between the first mold layer 300 and the second substrate 600. The horizontal portion HP may be interposed between the upper surface 300U of the first mold layer 300 and the lower surface 600L of the second substrate 600. The horizontal portion HP may be in contact with the upper surface 300U of the first mold layer 300 and the lower surface 600L of the second substrate 600. The horizontal portion HP may be positioned at substantially the same height as the bumps 420. The vertical portion VP may have a length 410H in the direction perpendicular to the upper surface 100U of the first substrate 100. The length 410H of the vertical portion VP may be greater than the length 420H of each of the bumps 420. The upper surface 410U of the vertical portion VP may be positioned at a height higher than a height the upper surfaces 420U of the bumps 420.

The vertical portion VP may have the inner side surfaces 410IS facing each other with the bumps 420 interposed therebetween. The second substrate 600 may be placed between the inner side surfaces 410IS of the vertical portion VP. When viewed in a plan view, the vertical portion VP may enclose a side surface of the second substrate 600. The upper surface 410U of the vertical portion VP may be located at a height higher than the lower surface 600L of the second substrate 600. When viewed in a plan view, the horizontal portion HP may be extended in an extension direction of the side surface of the second substrate 600. According to the present example embodiments, the horizontal portion HP of the guide pattern 410, along with the bumps 420, may serve as the motion stop layer to the downward motion of the second substrate 600 described with reference to FIG. 5. The horizontal portion HP of the guide pattern 410 may support the second substrate 600 to allow the second substrate 600 to be uniformly spaced apart from the first semiconductor chip 200 by a specific distance.

Figure 12:
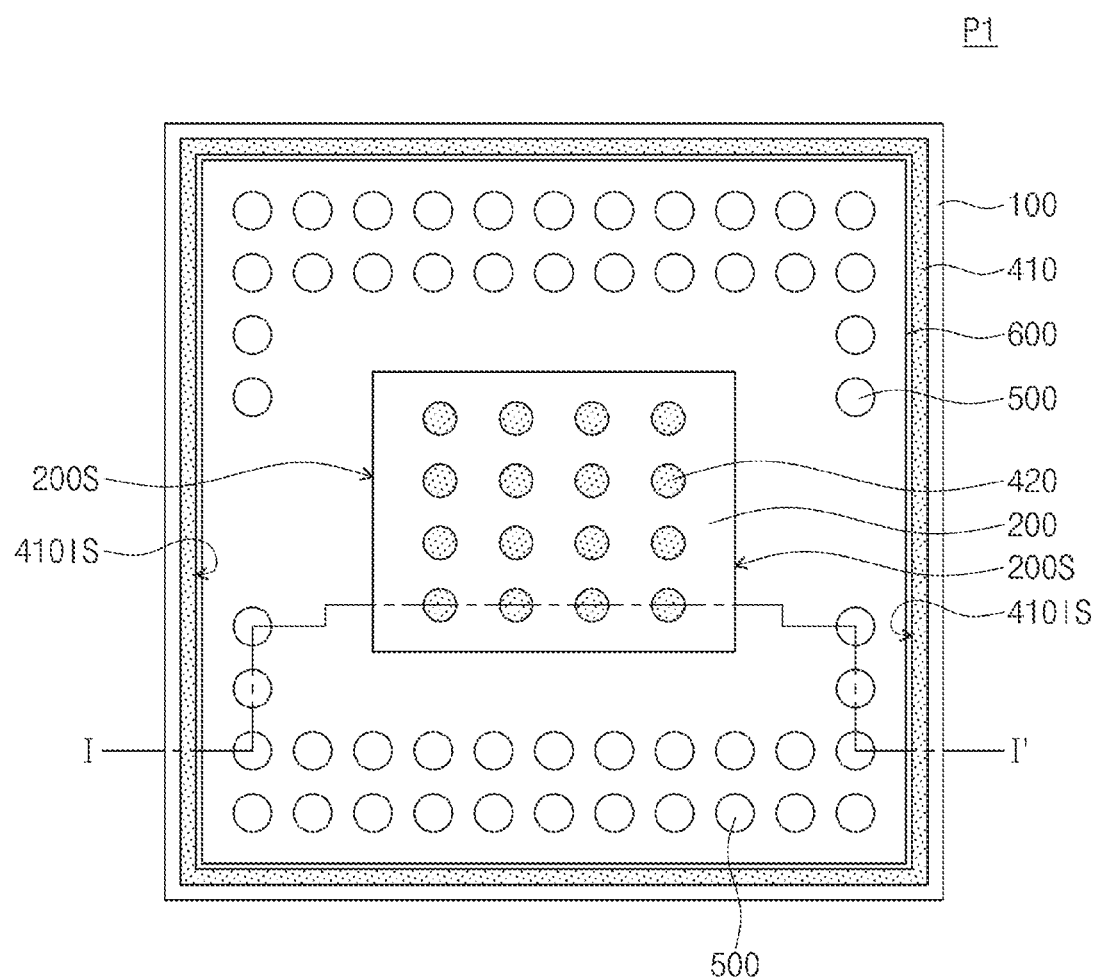
FIG. 12 is a plan view illustrating a first semiconductor package according to an example embodiment.
Figure 13:
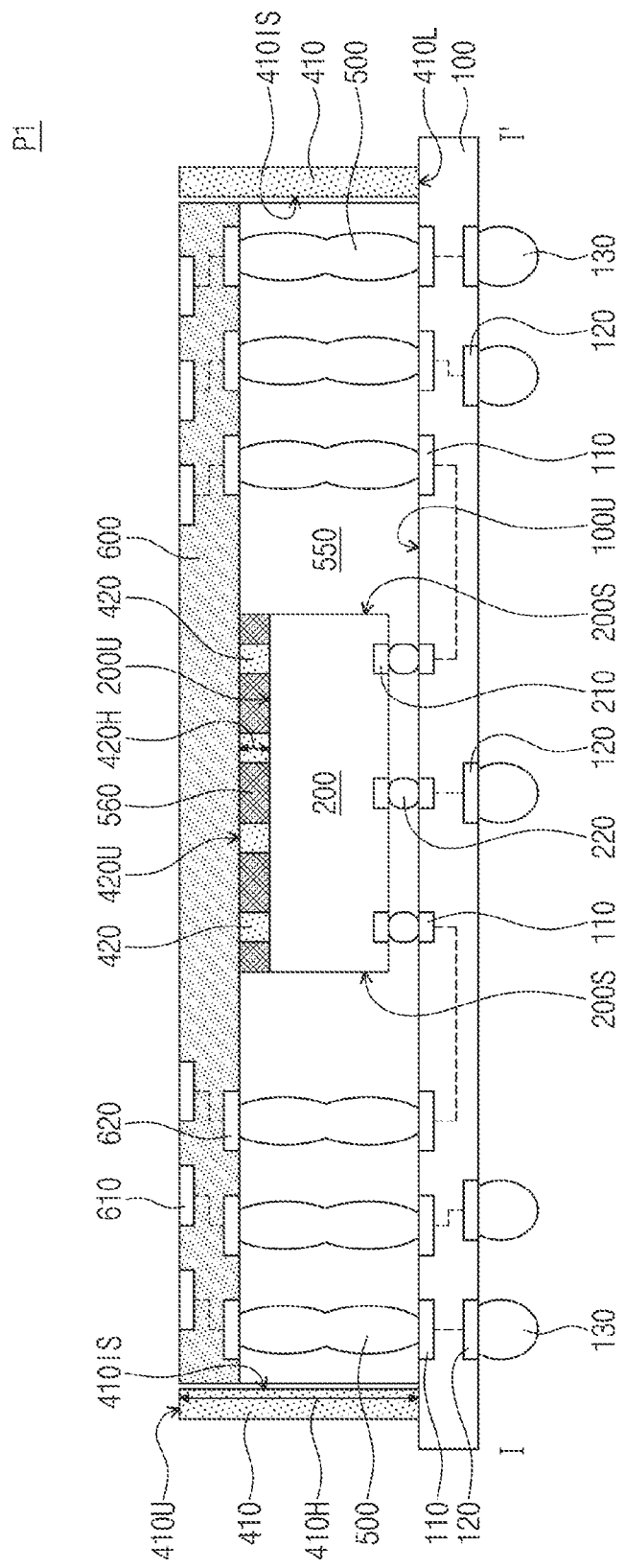
FIG. 13 is a sectional view taken along a line I-I' of FIG. 12.

FIG. 12 is a plan view illustrating the first semiconductor package P1 according to an example embodiment. FIG. 13 is a sectional view taken along a line I-I' of FIG. 12. For concise description, the description that follows will mainly refer to features of the first semiconductor package P1 different from that described with reference to FIGS. 1, 2 and 3A to 3D.

Referring to FIGS. 12 and 13, the first semiconductor chip 200 may be provided on the first substrate 100. According to the present example embodiments, the first mold layer 300 may be omitted. The solder structures 500 may be provided on the first substrate 100 and may be horizontally spaced apart from the first semiconductor chip 200. The bumps 420 may be provided on the upper surface 200U of the first semiconductor chip 200. The guide pattern 410 may be disposed on the upper surface 100U of the first substrate 100 and may be horizontally spaced apart from the first semiconductor chip 200. The guide pattern 410 may be in contact with the upper surface 100U of the first substrate 100. When viewed in a plan view, the guide pattern 410 may be provided to enclose the side surface 200S of the first semiconductor chip 200 and the solder structures 500 may be provided between the first semiconductor chip 200 and the guide pattern 410.

The guide pattern 410 may protrude from the upper surface 100U of the first substrate 100. The guide pattern 410 may have a length 410H in the direction perpendicular to the upper surface 100U of the first substrate 100. The length 410H of the guide pattern 410 may be greater than the length 420H of each of the bumps 420. The upper surface 410U of the guide pattern 410 may be positioned at a height higher than a height of the upper surfaces 420U of the bumps 420. A lower surface 410L of the guide pattern 410 may be located at substantially the same height as the upper surface 100U of the first substrate 100. The guide pattern 410 may have inner side surfaces 410IS, which are provided to face each other with the bumps 420 interposed therebetween. The second substrate 600 may be provided on the first semiconductor chip 200. The second substrate 600 may be disposed between the inner side surfaces 410IS of the guide pattern 410. When viewed in a plan view, the guide pattern 410 may be provided to enclose the side surface of the second substrate 600. The upper surface 410U of the guide pattern 410 may be located at a height higher than the lower surface 600L of the second substrate 600.

The heat transfer layer 560 may be interposed between the first semiconductor chip 200 and the second substrate 600. The heat transfer layer 560 may cover the upper surface 200U of the first semiconductor chip 200 and may intervene between the bumps 420. The heat transfer layer 560 may be substantially the same as the heat transfer layer 560 described with reference to FIG. 10. In some example embodiments, the under-fill layer 550 may be provided to fill a gap region between the first substrate 100 and the second substrate 600. In certain example embodiments, the under-fill layer 550 may be omitted.

Figure 14:
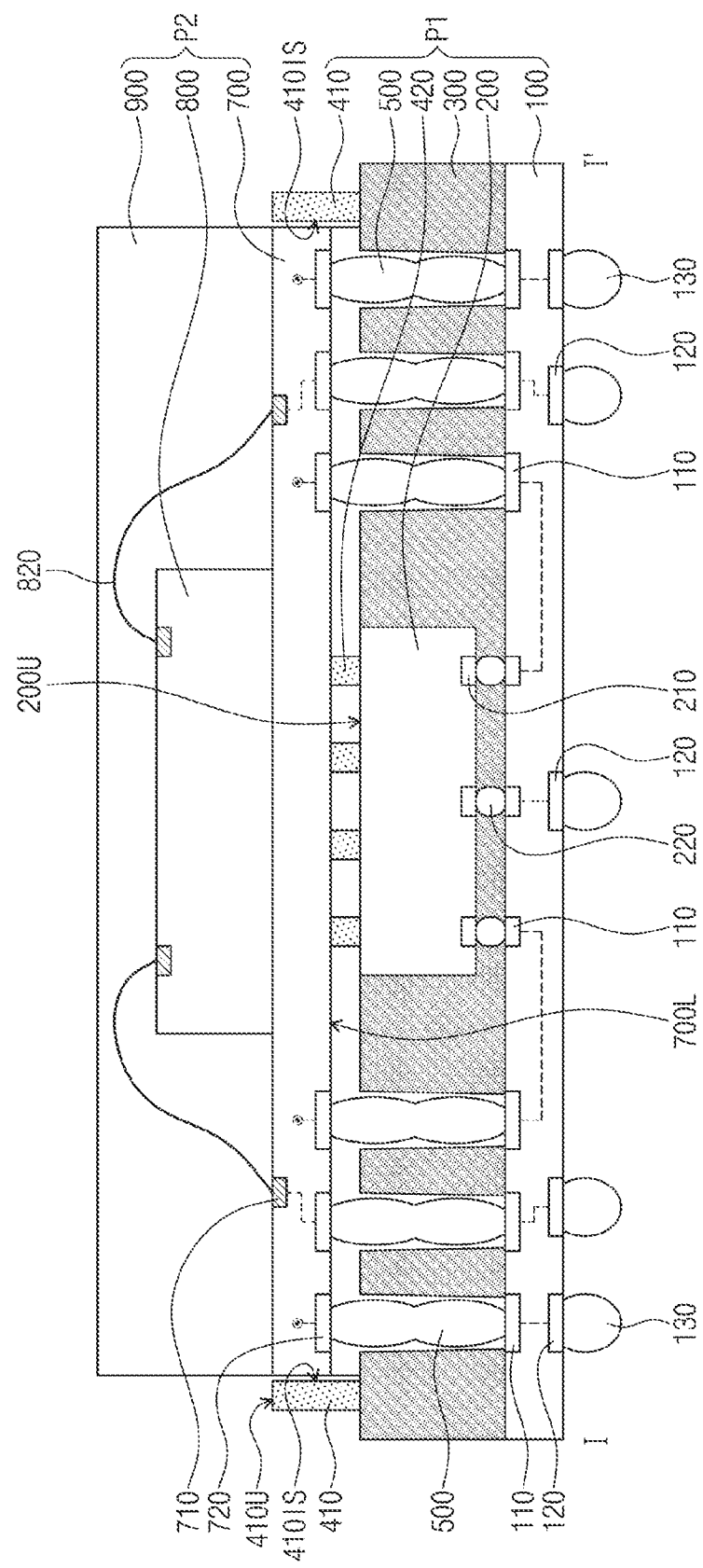
FIG. 14 is a sectional view illustrating a stack-type semiconductor package according to an example embodiment.

FIG. 14 is a sectional view illustrating a stack-type semiconductor package according to an example embodiment.

Referring to FIG. 14, the second semiconductor package P2 may be stacked on the first semiconductor package P1. Except for the absence of the second substrate 600, the first semiconductor package P1 may be substantially the same as the first semiconductor package P1 described with reference to FIGS. 1, 2 and 3A to 3D. The second semiconductor package P2 may include the third substrate 700, the second semiconductor chip 800, and the second mold layer 900. The third substrate 700 may include the upper substrate pads 710 and the lower substrate pads 720. The second semiconductor package P2 may be substantially the same as the second semiconductor package P2 described with reference to FIG. 9. According to the present example embodiments, the third substrate 700 may be provided on the first semiconductor chip 200 and the first mold layer 300. The solder structures 500 may connect the first substrate pads 110 of the first substrate 100 to the lower substrate pads 720 of the third substrate 700. The third substrate 700 may be electrically connected to the first substrate 100 and the first semiconductor chip 200 through the solder structures 500. The bumps 420 may be interposed between the first semiconductor chip 200 and the third substrate 700. The bumps 420 may be in contact with the upper surface 200U of the first semiconductor chip 200 and a lower surface 700L of the third substrate 700. The inner side surfaces 410IS of the guide pattern 410 may be provided to face each other with the bumps 420 interposed therebetween. The third substrate 700 may be provided between the inner side surfaces 410IS of the guide pattern 410. When viewed in a plan view, the guide pattern 410 may be provided to enclose a side surface of the third substrate 700. The upper surface 410U of the guide pattern 410 may be located at a height higher than the lower surface 700L of the third substrate 700.

In some example embodiments, the under-fill layer 550 may be interposed between the third substrate 700 and the first semiconductor chip 200 and between the third substrate 700 and the first mold layer 300. In certain example embodiments, the under-fill layer 550 may be omitted. According to the present example embodiments, the bumps 420 may support the third substrate 700 to allow the third substrate 700 to be uniformly spaced apart from the first semiconductor chip 200 by a specific distance. In addition, since the third substrate 700 is placed in the substrate mounting region defined by the inner side surfaces 410IS of the guide pattern 410, the first semiconductor package P1 and the second semiconductor package P2 may be prevented from being misaligned to each other. Thus, the solder structures 500 may be easily formed, and the electric short circuit between the solder structures 500 may be prevented.

Figure 15:
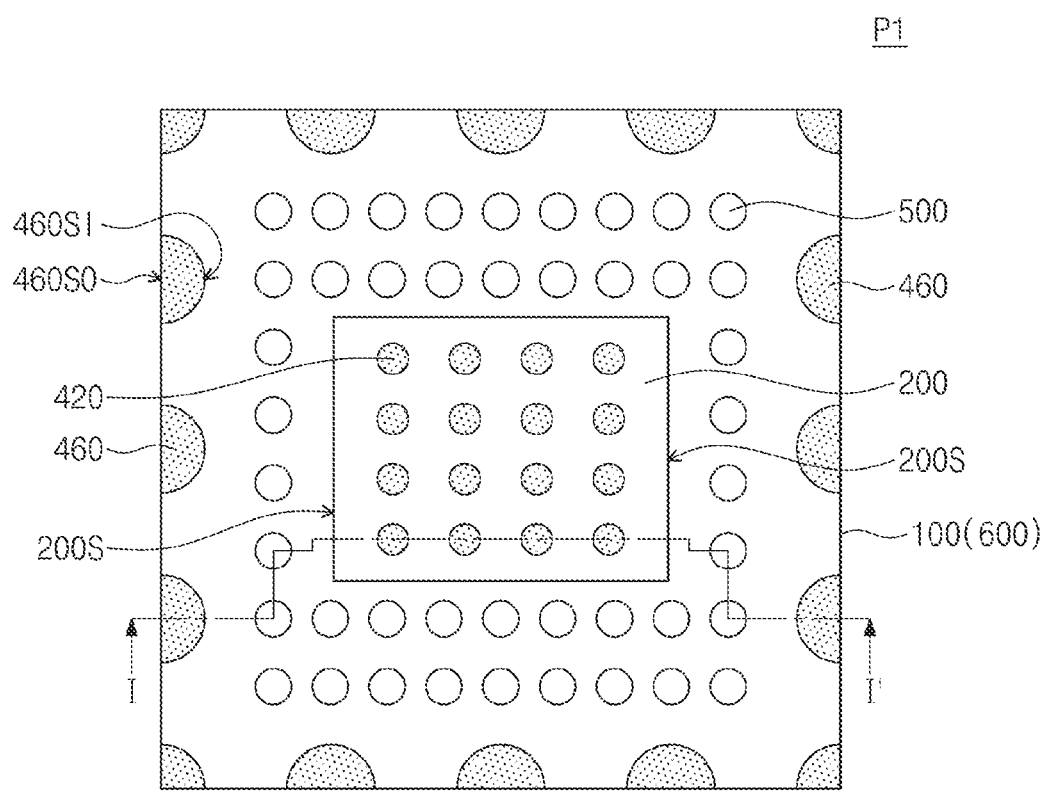
FIG. 15 is a plan view illustrating a first semiconductor package according to an example embodiment.
Figure 16:
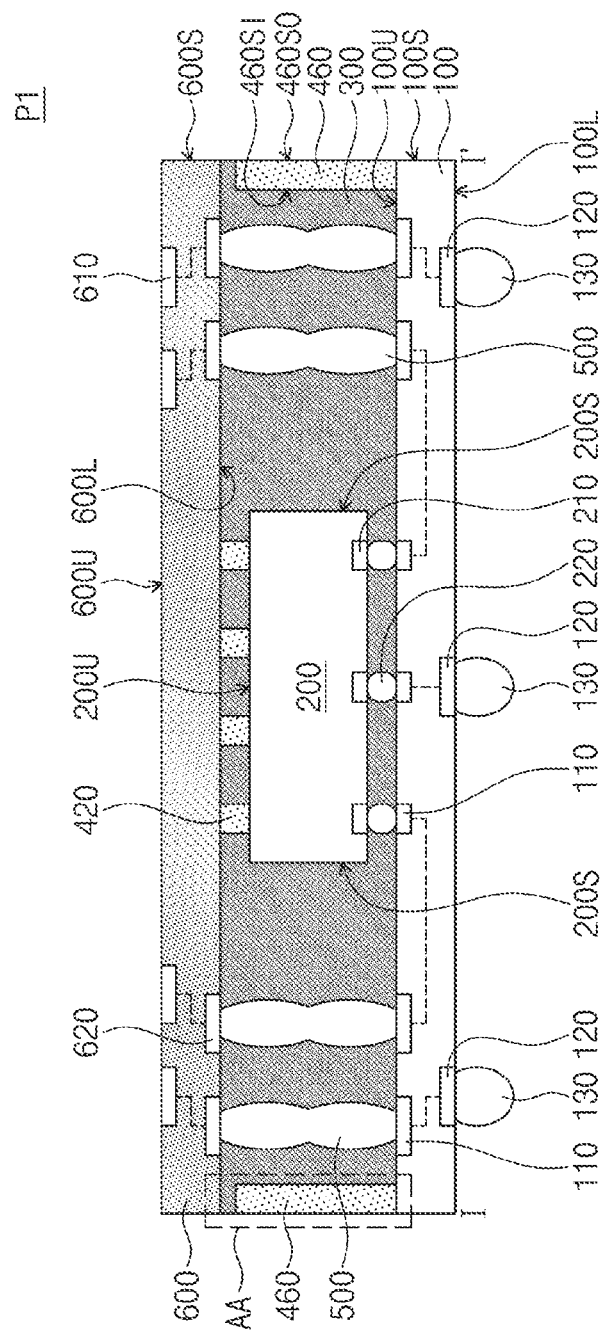
FIG. 16 is a sectional view taken along a line I-I' of FIG. 15.

FIG. 15 is a plan view illustrating the first semiconductor package P1 according to an example embodiment. FIG. 16 is a sectional view taken along a line I-I' of FIG. 15, and FIG. 17 is an enlarged view illustrating a portion 'AA' of FIG. 16.

Figure 17:
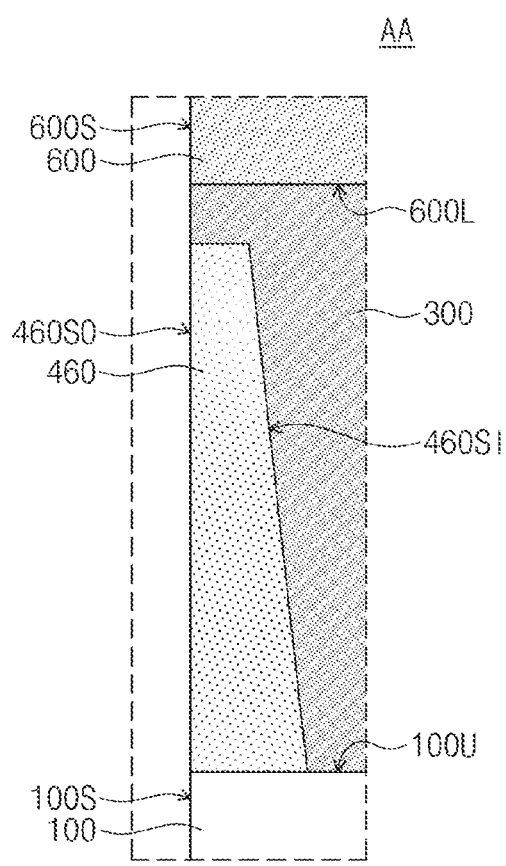
FIG. 17 is an enlarged view of a portion 'AA' of FIG. 16.

Referring to FIGS. 15 to 17, the first semiconductor chip 200 may be mounted on the first substrate 100. The first substrate 100 may be a printed circuit board with a circuit pattern or a redistribution layer. The first substrate 100 may include the first substrate pads 110 and the second substrate pads 120. The first substrate pads 110 may be provided on the upper surface 100U of the first substrate 100, and the second substrate pads 120 may be provided on the lower surface 100L of the first substrate 100. The second substrate pads 120 may be connected to corresponding pads of the first substrate pads 110 through internal interconnection lines in the first substrate 100. The first substrate pads 110 and the second substrate pads 120 may be formed of or include at least one of conductive materials. The outer terminals 130 may be provided on the lower surface 100L of the first substrate 100 and may be connected to the second substrate pads 120. The outer terminals 130 may be formed of or include at least one of conductive materials and may be provided in the form of solder balls.

The first semiconductor chip 200 may include the chip pads 210 provided on a lower surface thereof. The connecting portions 220 may be provided between the first substrate 100 and the first semiconductor chip 200 and may be connected to the chip pads 210, respectively. The connecting portions 220 may be connected to corresponding pads of the first substrate pads 110. The first semiconductor chip 200 may be electrically connected to the first substrate 100 through the connecting portions 220. The chip pads 210 and the connecting portions 220 may be formed of or include at least one of conductive materials. Each of the connecting portions 220 may include one of solder balls, bumps, or pillars. The first semiconductor chip 200 may include integrated circuits, and the integrated circuits may be adjacent to the lower surface of the first semiconductor chip 200. The first semiconductor chip 200 may be a logic chip. As an example, the first semiconductor chip 200 may be a non-memory chip (e.g., an application processor).

The second substrate 600 may be provided on the first substrate 100, and the first semiconductor chip 200 may be provided between the first substrate 100 and the second substrate 600. As an example, the second substrate 600 may be an interposer substrate and may be formed of or include at least one of insulating resins. The insulating resin may include a solder resist material (e.g., photosensitive polyimide), but embodiments are not limited to this example. The first pads 610 may be provided on the upper surface 600U of the second substrate 600, and the second pads 620 may be provided on the lower surface 600L of the second substrate 600. Interconnection lines in the second substrate 600 may connect the first pads 610 and the second pads 620 electrically to each other. The first pads 610 and the second pads 620 may be formed of or include at least one of conductive or metallic materials (e.g., copper or aluminum).

The solder structures 500 may be provided between the first substrate 100 and the second substrate 600 and may be horizontally spaced apart from the first semiconductor chip 200. The solder structures 500 may be connected to corresponding pads of the first substrate pads 110. Each of the solder structures 500 may be electrically connected to the outer terminal 130 or the first semiconductor chip 200. The solder structures 500 may be connected to the second pads 620. The second substrate 600 may be electrically connected to the first substrate 100 and the first semiconductor chip 200 through the solder structures 500. The solder structures 500 may be formed of or include at least one of conductive materials (e.g., tin, lead, silver, or alloys thereof).

A plurality of supporting patterns 460 may be provided between the first substrate 100 and the second substrate 600 and may be horizontally spaced apart from the first semiconductor chip 200. The solder structures 500 may be provided between the first semiconductor chip 200 and the supporting patterns 460. When viewed in a plan view, the supporting patterns 460 may be arranged to enclose the first semiconductor chip 200. For example, when viewed in a plan view, the supporting patterns 460 may be arranged along the side surfaces 200S of the first semiconductor chip 200. At least two patterns of the supporting patterns 460 may be spaced apart from each other in an extension direction of one of the side surfaces 200S of the first semiconductor chip 200, when viewed in a plan view. The supporting patterns 460 may have a pillar shape and protrude from the upper surface 100U of the first substrate 100.

An outer side surface 460SO of each of the supporting patterns 460 may be aligned to a side surface 100S of the first substrate 100 and a side surface 600S of the second substrate 600. Each of the supporting patterns 460 may have an inner side surface 460SI facing the outer side surface 460SO. In some example embodiments, the inner side surface 460SI of each of the supporting patterns 460 may be inclined at an angle relative to the upper surface 100U of the first substrate 100, when viewed in a sectional view. In this case, each of the supporting patterns 460 may be formed in such a way that its upper width is smaller than its lower width. In some example embodiments, at least one of the supporting patterns 460 may be spaced apart from the lower surface 600L of the second substrate 600. For example, each of the supporting patterns 460 may be spaced apart from the lower surface 600L of the second substrate 600. The supporting patterns 460 may be formed of or include at least one of insulating materials (e.g., insulating polymer materials or solder resist materials).

The bumps 420 may be provided between the first semiconductor chip 200 and the second substrate 600 and may be horizontally spaced apart from each other on the upper surface 200U of the first semiconductor chip 200. The bumps 420 may have a pillar shape and extend from the upper surface 200U of the first semiconductor chip 200 to the lower surface 600L of the second substrate 600. The bumps 420 may be in contact with the upper surface 200U of the first semiconductor chip 200 and the lower surface 600L of the second substrate 600. In some example embodiments, the bumps 420 may be formed of or include the same material as the second substrate 600. In certain example embodiments, the bumps 420 may be formed of or include the same material as the supporting patterns 460. The bumps 420 may include at least one of insulating polymer materials, conductive polymer materials, or solder resist materials.

The first mold layer 300 may be provided between the first substrate 100 and the second substrate 600 to cover the first semiconductor chip 200 and the solder structures 500. The first mold layer 300 may be provided to fill a gap region between the first substrate 100 and the first semiconductor chip 200 and to seal the connecting portions 220. The first mold layer 300 may be provided to fill a gap region between the second substrate 600 and the first semiconductor chip 200 and may be interposed between the bumps 420. The first mold layer 300 may be provided to cover the inner side surface 460SI of each of the supporting patterns 460. The first mold layer 300 may be extended between at least one of the supporting patterns 460 and the lower surface 600L of the second substrate 600 and may be interposed therebetween. As an example, the first mold layer 300 may be interposed between the lower surface 600L of the second substrate 600 and each of the supporting patterns 460. The first mold layer 300 may be formed of or include at least one of epoxy molding compounds or insulating resins.

Figure 18:
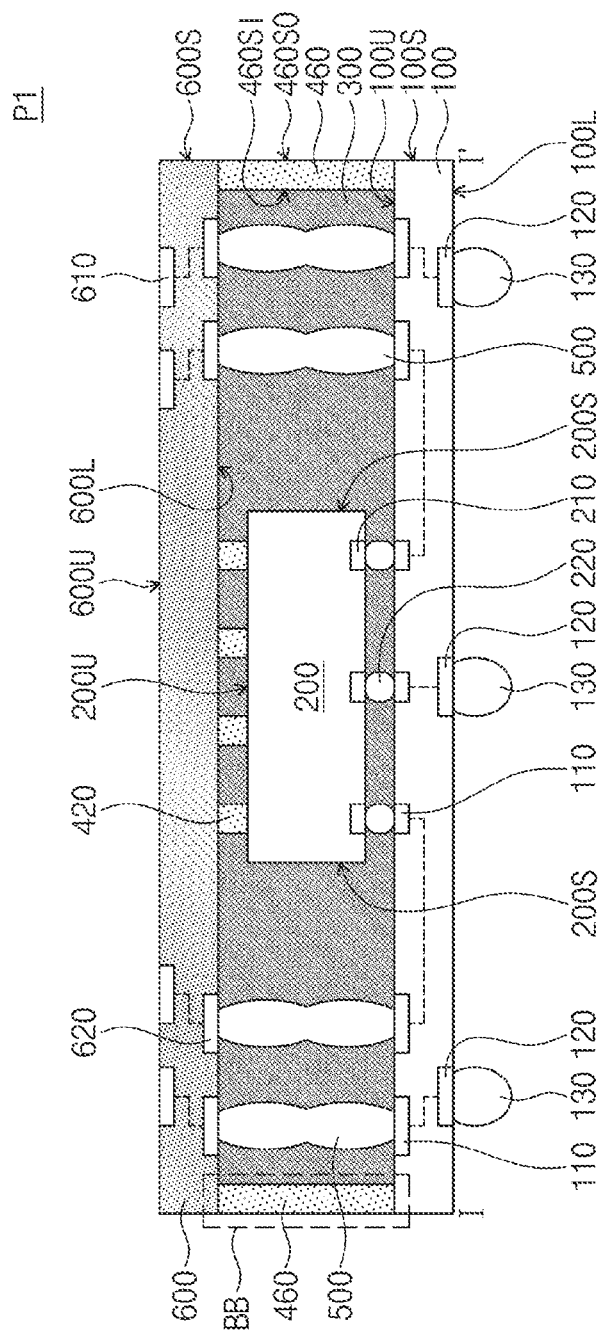
FIG. 18 is a sectional view illustrating a modified structure of a first semiconductor package according to an example embodiment, taken along a line I-I' of FIG. 15.
Figure 19:
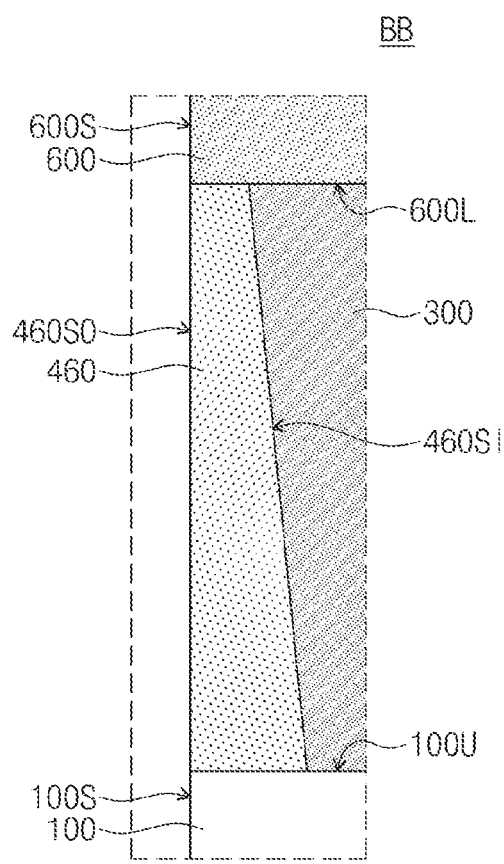
FIG. 19 is an enlarged view of a portion a portion 'BB' of FIG. 18.

FIG. 18 is a sectional view illustrating a modified structure of the first semiconductor package P1 according to an example embodiment, taken along a line I-I' of FIG. 15. FIG. 19 is an enlarged view of a portion a portion 'BB' of FIG. 18. For concise description, the description that follows will mainly refer to features of the first semiconductor package P1 different from that described with reference to FIGS. 15 to 17.

Referring to FIGS. 15, 18, and 19, the supporting patterns 460 according to the present example embodiments may be in contact with the lower surface 600L of the second substrate 600. Thus, the first mold layer 300 may not be interposed between the supporting patterns 460 and the lower surface 600L of the second substrate 600.

Figure 20:
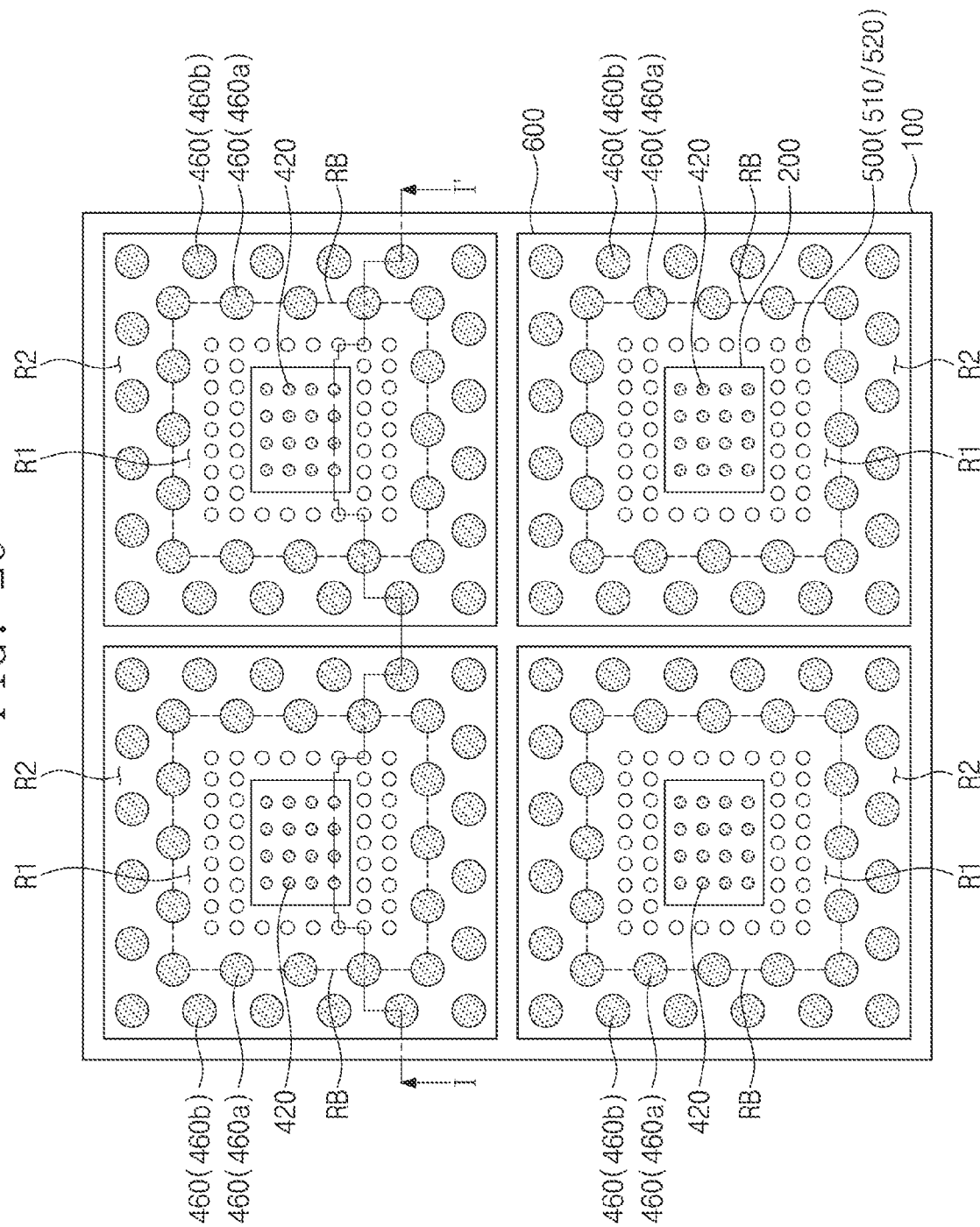
FIG. 20 is a plan view illustrating a method of fabricating a first semiconductor package according to an example embodiment.
Figure 21:
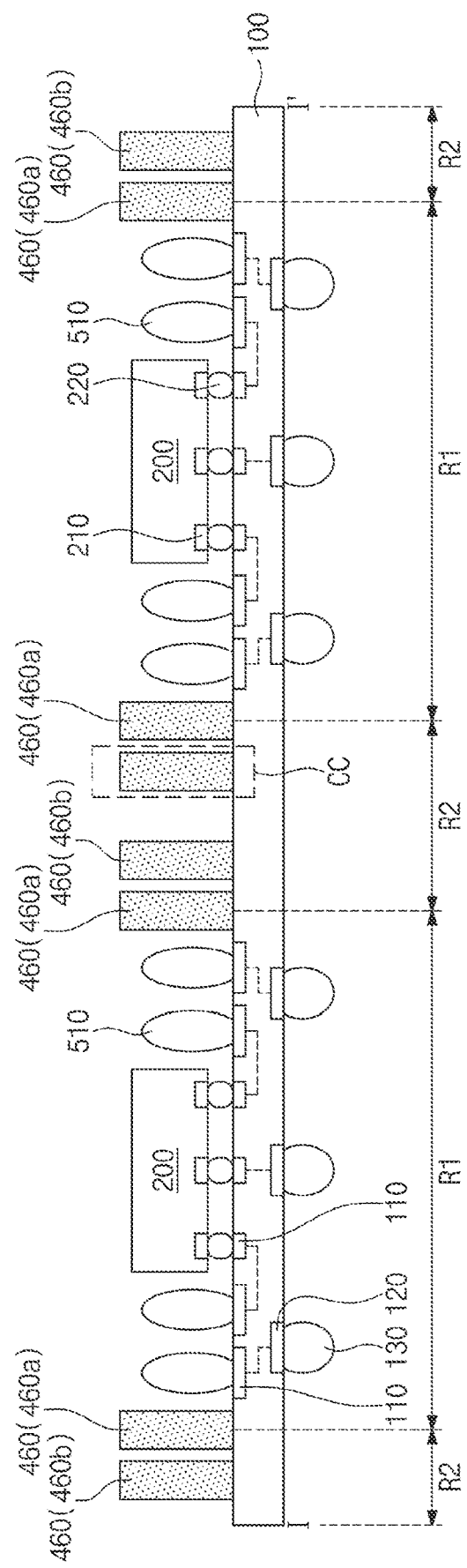
FIGS. 21 to 24 are sectional views illustrating a method of fabricating a first semiconductor package according to an example embodiment, taken along a line corresponding to a line I-I' of FIG. 20.
Figure 25:
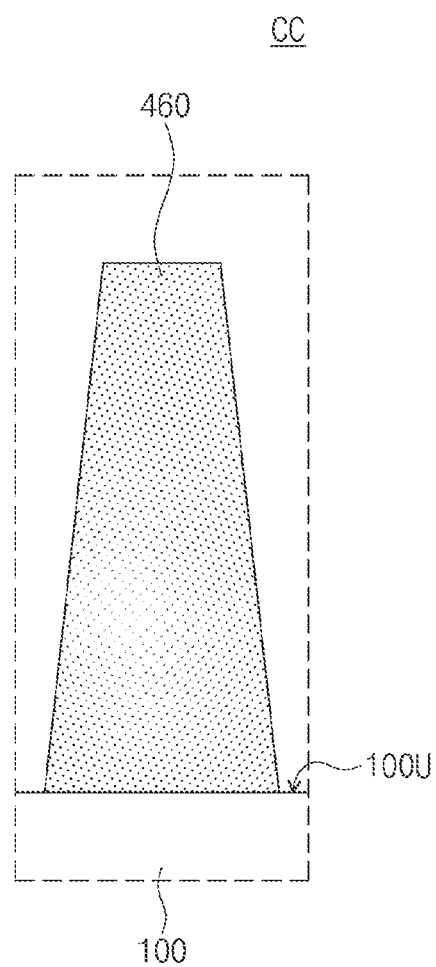
FIG. 25 is an enlarged view of a portion CC of FIG. 21.
Figure 26:
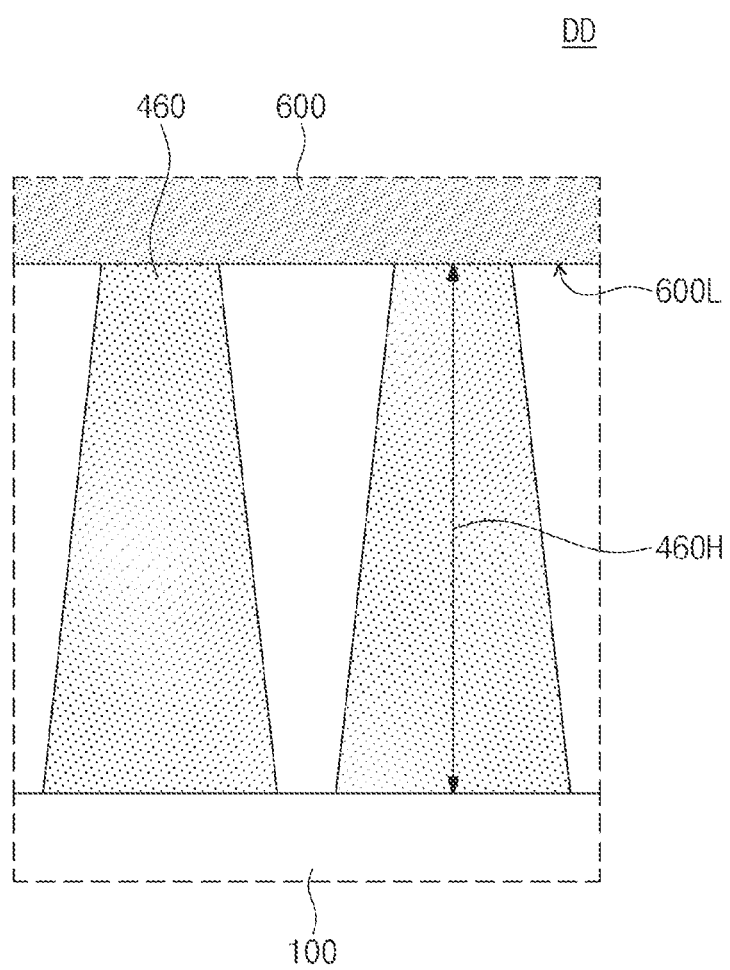
FIG. 26 is an enlarged view of a portion DD of FIG. 23.
Figure 27:
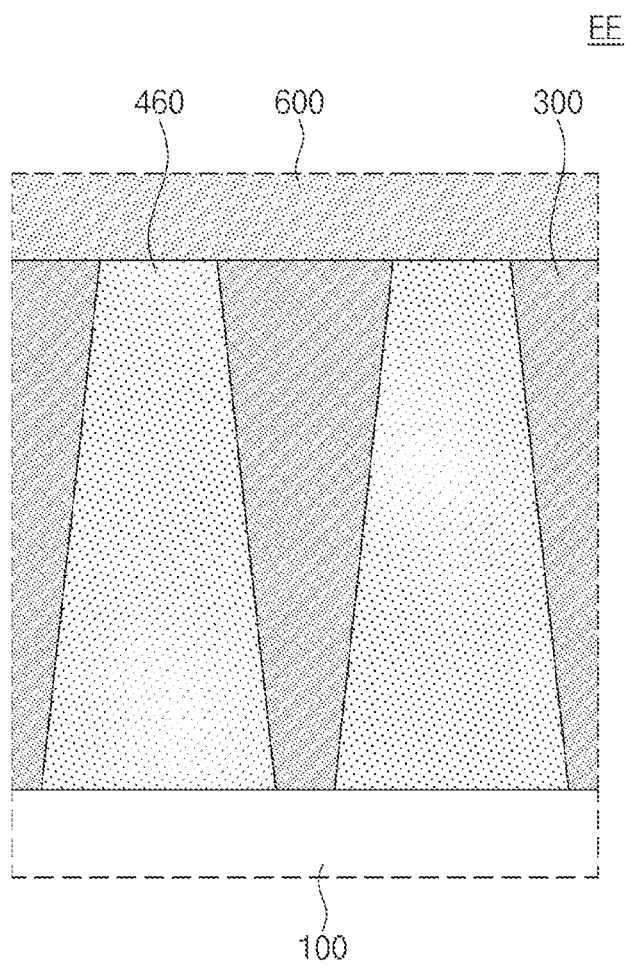
FIG. 27 is an enlarged view of a portion EE of FIG. 24.

FIG. 20 is a plan view illustrating a method of fabricating the first semiconductor package P1 according to an example embodiment. FIGS. 21 to 24 are sectional views illustrating a method of fabricating the first semiconductor package P1 according to an example embodiment, taken along a line I-I' of FIG. 20. FIG. 25 is an enlarged view of a portion CC of FIG. 21, FIG. 26 is an enlarged view of a portion DD of FIG. 23, and FIG. 27 is an enlarged view of a portion EE of FIG. 24. In order to avoid redundancy, overlapping description of the first semiconductor package P1 described with reference to FIGS. 15 to 19 may be omitted.

Referring to FIGS. 20, 21, and 25, the first substrate 100 including a mount region R1 and a dummy region R2 may be provided. The mount region R1 may be a region of the first substrate 100, on which the first semiconductor chip 200 is mounted, and the dummy region R2 may be another region of the first substrate 100, which will be removed by a subsequent sawing process. In some example embodiments, the first substrate 100 may include a plurality of mount regions R1, and the dummy region R2 may be provided to enclose each of the mount regions R1. The dummy region R2 may be interposed between adjacent ones of the mount regions R1.

A plurality of first semiconductor chips 200 may be respectively mounted on the mount regions R1 of the first substrate 100. Each of the first semiconductor chips 200 may include the chip pads 210 provided on a lower surface thereof. The connecting portions 220 may be provided between the first substrate 100 and each of the first semiconductor chips 200 and may be connected to the chip pads 210, respectively. Each of the first semiconductor chips 200 may be electrically connected to the first substrate 100 through the connecting portions 220. The lower solder balls 510 may be formed on each of the mount regions R1 of the first substrate 100. The lower solder balls 510 may be electrically connected to the outer terminals 130 or the first semiconductor chips 200. The lower solder balls 510 may be formed of or include at least one of conductive materials (e.g., tin, lead, silver, or alloys thereof).

A plurality of the supporting patterns 460 may be formed on the first substrate 100. The supporting patterns 460 may include first supporting patterns 460a, which are formed on a border RB between the dummy region R2 and each of the mount regions R1, and second supporting patterns 460b, which are formed on the dummy region R2. When viewed in a plan view, the first supporting patterns 460a may enclose each of the first semiconductor chips 200. The lower solder balls 510 may be provided between the first supporting patterns 460a and each of the first semiconductor chips 200. When viewed in a plan view, the second supporting patterns 460b may enclose each of the first semiconductor chips 200, and the first supporting patterns 460a may be provided between the second supporting patterns 460b and each of the first semiconductor chips 200. In some example embodiments, the formation of the second supporting patterns 460b may be omitted.

The supporting patterns 460 may be formed by an inkjet printing process or a screen printing process. The supporting patterns 460 may be printed in a desired pattern shape on the upper surface 100U of the first substrate 100. The supporting patterns 460 may have a pillar shape and protrude from the upper surface 100U of the first substrate 100. In some example embodiments, each of the supporting patterns 460 may be formed in such a way that its upper width is smaller than its lower width. The supporting patterns 460 may be formed of or include at least one of insulating materials (e.g., insulating polymer materials or solder resist materials).

Figure 22:
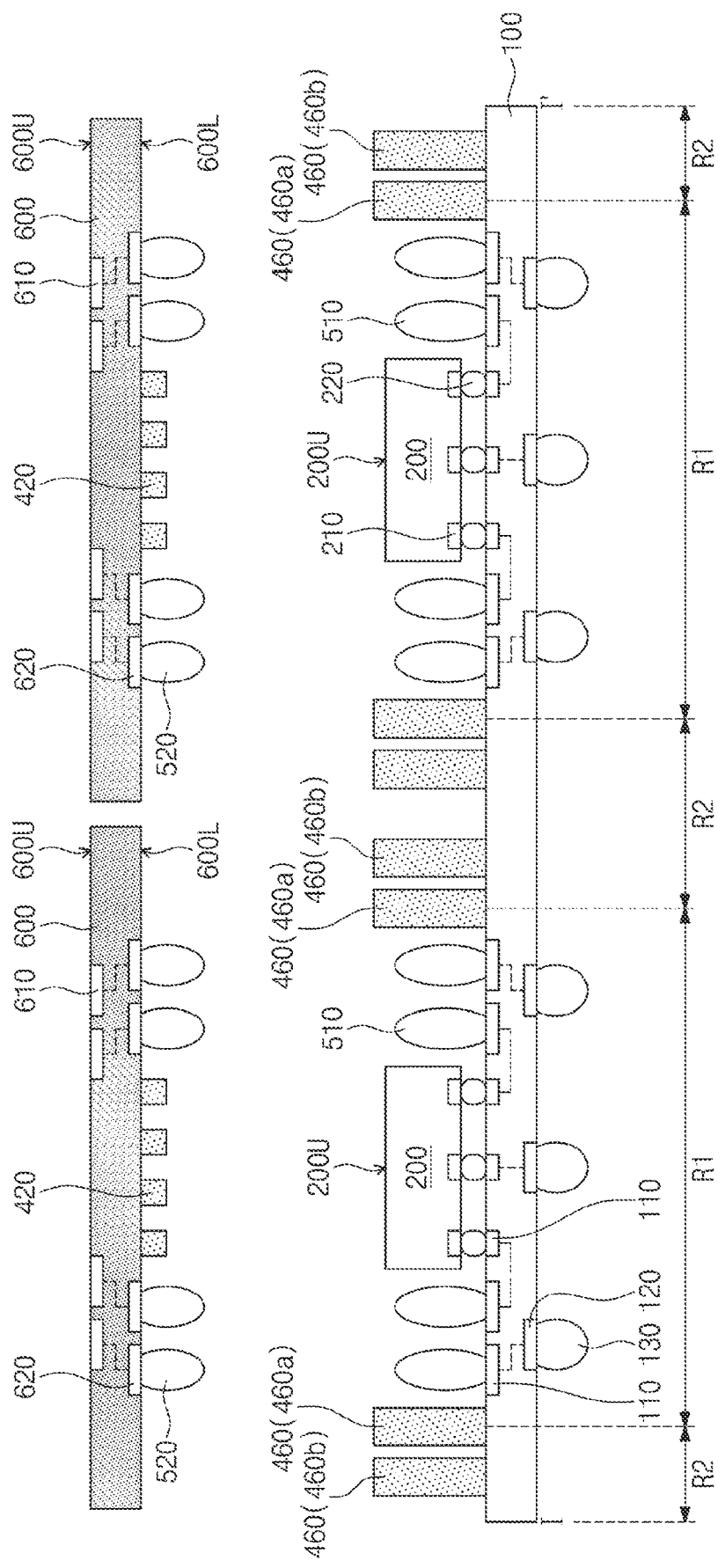
Figure 23:
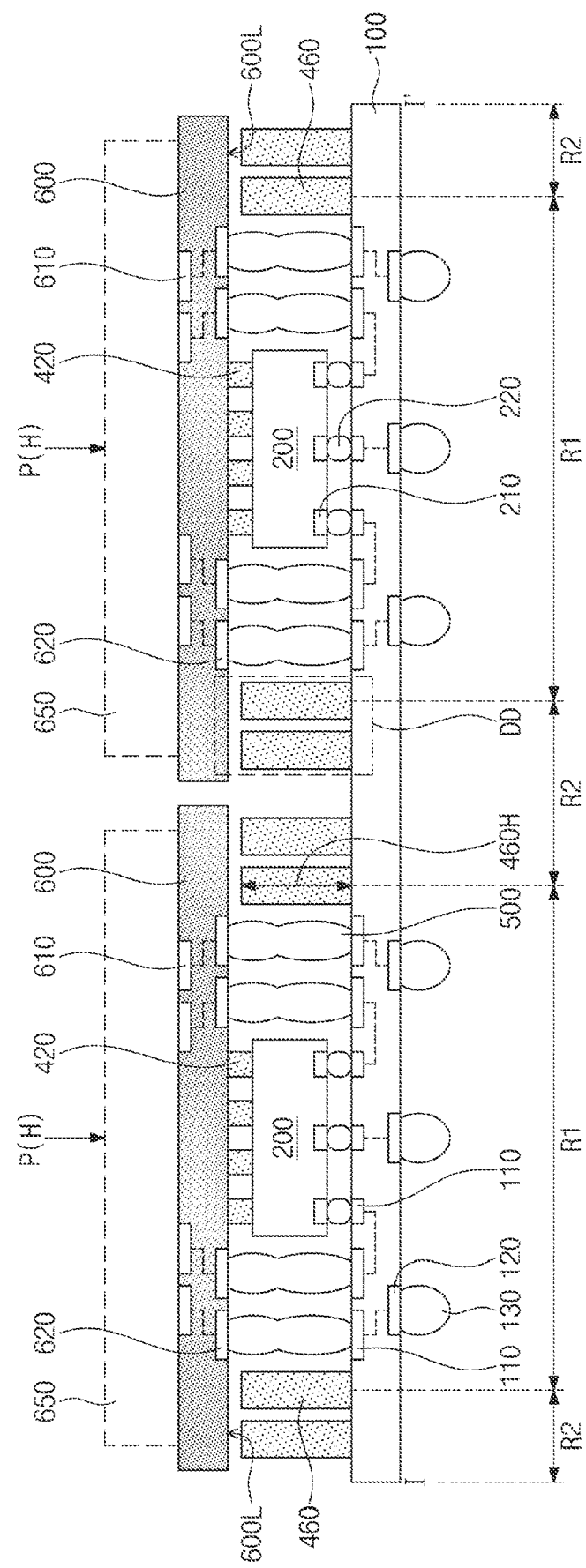

Referring to FIGS. 20 and 22, a plurality of second substrates 600 may be provided on the first substrate 100. The second substrates 600 may be used as interposer substrates. The second substrates 600 may be overlapped with the mount regions R1, respectively, of the first substrate 100. The first pads 610 may be provided on the upper surface 600U of each of the second substrates 600, and the second pads 620 may be provided on the lower surface 600L of each of the second substrates 600. Each of the second substrates 600 may be provided in such a way that the lower surface 600L thereof faces a corresponding one of the first semiconductor chip 200. The upper solder balls 520 may be provided on the lower surface 600L of each of the second substrates 600 and may be connected to the second pads 620. The upper solder balls 520 may be formed of or include at least one of conductive materials (e.g., tin, lead, silver, or alloys thereof). Each of the second substrates 600 may be provided on the first substrate 100 in such a way that the upper solder balls 520 are aligned to the lower solder balls 510, respectively.

A plurality of the bumps 420 may be formed on the lower surface 600L of each of the second substrates 600. The bumps 420 may be formed in a region that is horizontally spaced apart from the upper solder balls 520. The bumps 420 may be provided to face the upper surface 200U of each of the first semiconductor chips 200. The bumps 420 may have a pillar shape and protrude from the lower surface 600L of each of the second substrates 600. In some example embodiments, the bumps 420 may be formed of or include the same material as each of the second substrates 600. In certain example embodiments, the bumps 420 may be formed of the same material as the supporting patterns 460. In this case, the bumps 420 may be formed by an inkjet printing process or a screen printing process.

Referring to FIGS. 20, 23, and 26, the second substrates 600 may be downwardly moved onto the mount regions R1, respectively, of the first substrate 100. In this case, pressure P may be exerted on the second substrates 600 to allow the upper solder balls 520 to be in close contact with the lower solder balls 510. For example, a dumbbell 650 may be provided on each of the second substrates 600 to exert the pressure P on each of the second substrates 600. During the downward motion of each of the second substrates 600, the bumps 420 and the supporting patterns 460 may support the second substrates 600. According to the present example embodiments, the supporting patterns 460 may support the second substrates 600 to allow each of the second substrates 600 to be uniformly spaced apart from the first substrate 100 by a specific distance. Thus, even when a relatively large pressure P is exerted on each of the second substrates 600, it may be possible to prevent an edge region of each of the second substrates 600 from being bent toward the first substrate 100.

Heat H may be applied to the first substrate 100 and the second substrates 600 to allow the upper solder balls 520 and the lower solder balls 510 to form junctions. The heat H may be applied to the first substrate 100 and the second substrates 600, when the pressure P is exerted on the second substrates 600. As an example, the second substrates 600 may be bonded to the first substrate 100 by a thermal compression bonding method. As the upper solder balls 520 and the lower solder balls 510 form the junctions, the solder structures 500 may be formed. The solder structures 500 may be connected to the first substrate pads 110 of the first substrate 100 and the second pads 620 of each of the second substrates 600.

After the process of bonding each of the second substrates 600 on the first substrate 100, the dumbbell 650 may be removed. Depending on a vertical height 460H of the supporting patterns 460, the supporting patterns 460 may be separated from or in contact with the lower surface 600L of each of the second substrates 600, after the removal of the dumbbell 650. For example, in the case where the vertical height 460H of the supporting patterns 460 is relatively small, the supporting patterns 460 may be spaced apart from the lower surface 600L of each of the second substrates 600, after the removal of the dumbbell 650. By contrast, in the case where the vertical height 460H of the supporting patterns 460 is relatively large, the supporting patterns 460 may be in contact with the lower surface 600L of each of the second substrates 600, after the removal of the dumbbell 650, as shown in FIG. 26.

Figure 24:
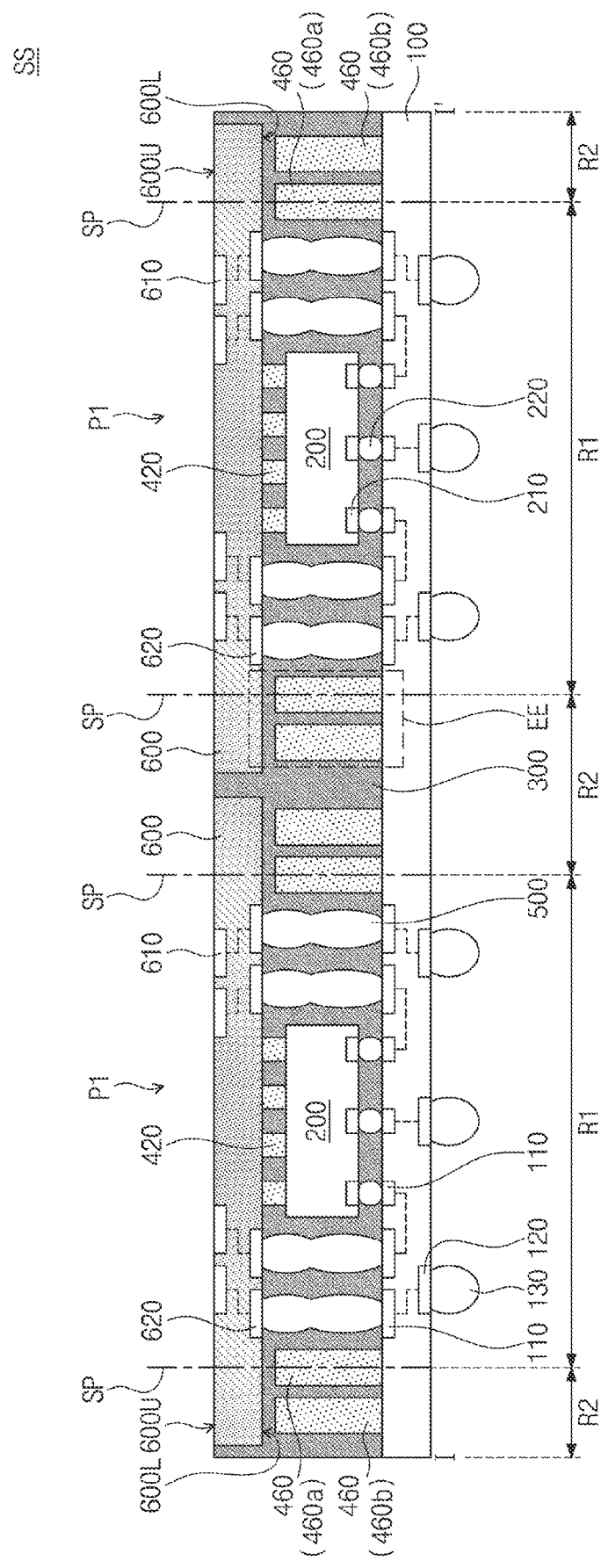

Referring to FIGS. 20, 24, and 27, the first mold layer 300 may be formed to fill a gap region between the first substrate 100 and the second substrates 600 and a gap region between the second substrates 600. The first mold layer 300 may expose the upper surfaces 600U of the second substrates 600. In some example embodiments, the supporting patterns 460 may be spaced apart from the lower surface 600L of each of the second substrates 600. In this case, the first mold layer 300 may cover the side surfaces of the supporting patterns 460 and may be extended into regions between the supporting patterns 460 and the lower surface 600L of each of the second substrates 600. In certain example embodiments, as shown in FIG. 27, the supporting patterns 460 may be in contact with the lower surface 600L of each of the second substrates 600, and the first mold layer 300 may cover the side surfaces of the supporting patterns 460.

A stack SS including a plurality of the first semiconductor packages P1 may be formed, as a result of the afore-described processes. A sawing process SP may be performed on the stack SS to divide the stack SS into the plurality of the first semiconductor packages P1. The dummy region R2 of the first substrate 100 and structures on the dummy region R2 may be removed by the sawing process SP. As an example, the second supporting patterns 460*b* of the supporting patterns 460 may be removed by the sawing process SP. The first supporting patterns 460*a* of the supporting patterns 460 may be formed on the border RB between the dummy region R2 and each of the mount regions R1 of the first substrate 100. Thus, a portion of each of the first supporting patterns 460*a*, which is located outside the border RB, may be removed by the sawing process SP. After the sawing process SP, a portion of each of the first supporting patterns 460*a*, which is located inside the border RB, may remain on a corresponding one of the mount region R1 and may constitute a corresponding one of the first semiconductor package P1.

Figure 28:
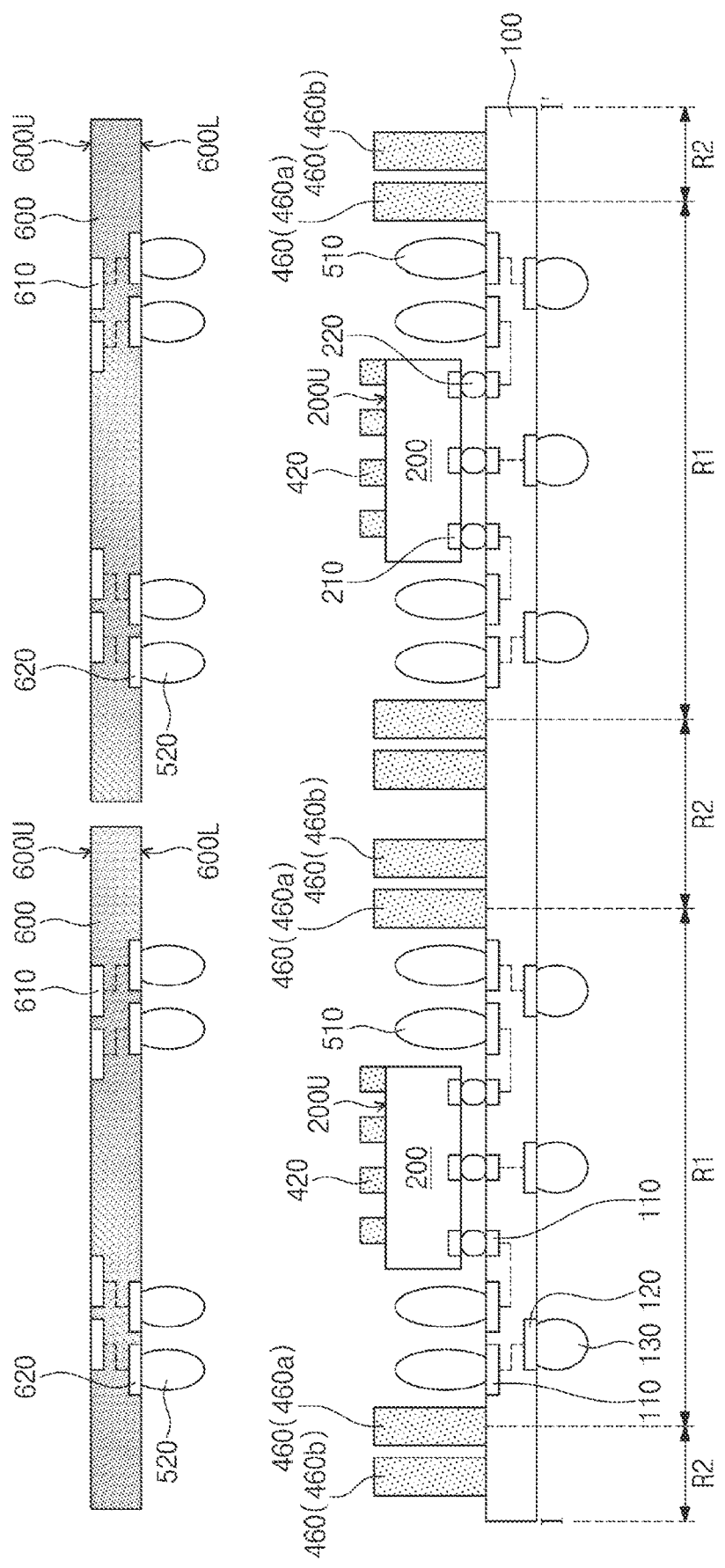
FIG. 28 is a sectional view illustrating a method of fabricating a first semiconductor package according to a modified example embodiment, taken along a line corresponding to the line I-I' of FIG. 20.

FIG. 28 is a sectional view illustrating a method of fabricating the first semiconductor package P1 according to a modified example embodiment, taken along a line corresponding to the line I-I' of FIG. 20. For concise description, the description that follows will mainly refer to features in the fabrication method, which is different from that described with reference to FIGS. 20 to 27.

Referring to FIG. 28, the bumps 420 may be formed on the upper surface 200U of each of the first semiconductor chips 200. The bumps 420 may have a pillar shape and protrude from the upper surface 200U of each of the first semiconductor chips 200. According to the present example embodiments, the bumps 420 may be formed of or include the same material as the supporting patterns 460. The bumps 420 may be formed by an inkjet printing process or a screen printing process.

Figure 29:
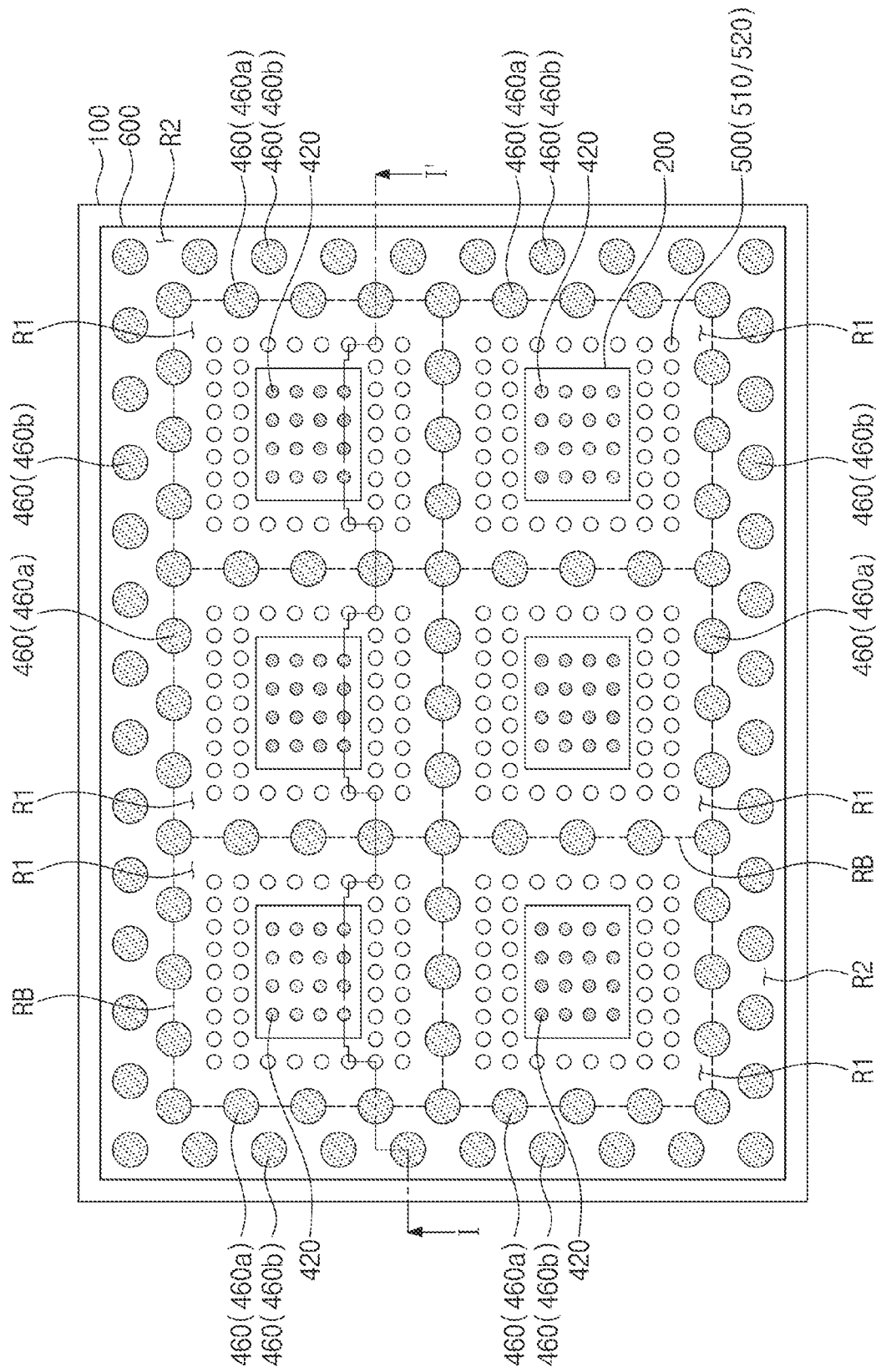
FIG. 29 is a plan view illustrating a method of fabricating a first semiconductor package according to an example embodiment.

FIG. 29 is a plan view illustrating a method of fabricating a first semiconductor package according to an example embodiment. FIGS. 30 to 33 are sectional views illustrating a method of fabricating the first semiconductor package P1 according to an example embodiment, taken along a line corresponding to a line I-I' of FIG. 29. For concise description, the description that follows will mainly refer to features in the fabrication method, which is different from that described with reference to FIGS. 20 to 27.

Figure 30:
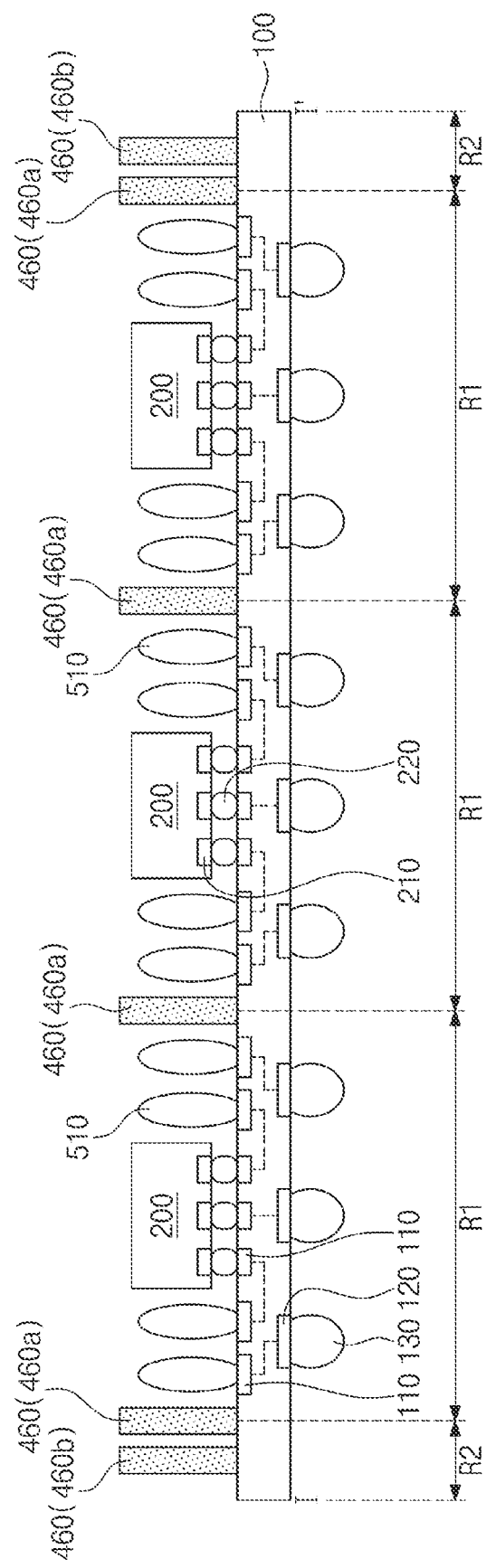
FIGS. 30 to 33 are sectional views illustrating a method of fabricating a first semiconductor package according to an example embodiment, taken along a line corresponding to a line I-I' of FIG. 29.

Referring to FIGS. 29 and 30, the first substrate 100 including the mount region R1 and the dummy region R2 may be provided. According to the present example embodiments, the first substrate 100 may include a plurality of the mount regions R1, which are provided adjacent to each other, and the dummy region R2 may be provided to enclose the plurality of the mount regions R1. Each of the mount regions R1 may be directly connected to others of the mount regions R1 adjacent thereto. In other words, the dummy region R2 may not be interposed between adjacent ones of mount regions R1. The first semiconductor chips 200 may be mounted on the mount regions R1, respectively, of the first substrate 100, and the lower solder balls 510 may be formed on each of the mount regions R1 of the first substrate 100.

The supporting patterns 460 may be formed on the first substrate 100. The supporting patterns 460 may include the first supporting patterns 460*a* and the second supporting patterns 460*b*. According to the present example embodiments, the first supporting patterns 460*a* may be formed on the border RB between the dummy region R2 and each of the mount regions R1 and between adjacent ones of mount regions R1, and the second supporting patterns 460*b* may be formed on the dummy region R2. When viewed in a plan view, the first supporting patterns 460*a* may enclose each of the first semiconductor chips 200. At least some of the first supporting patterns 460*a* may be formed between adjacent ones of the first semiconductor chips 200. The lower solder balls 510 may be provided between the first supporting patterns 460*a* and each of the first semiconductor chips 200. When viewed in a plan view, the second supporting patterns 460*b* may enclose the first semiconductor chips 200, and the first supporting patterns 460*a* may be formed between the second supporting patterns 460*b* and each of the first semiconductor chips 200. In some example embodiments, the formation of the second supporting patterns 460*b* may be omitted.

Figure 31:
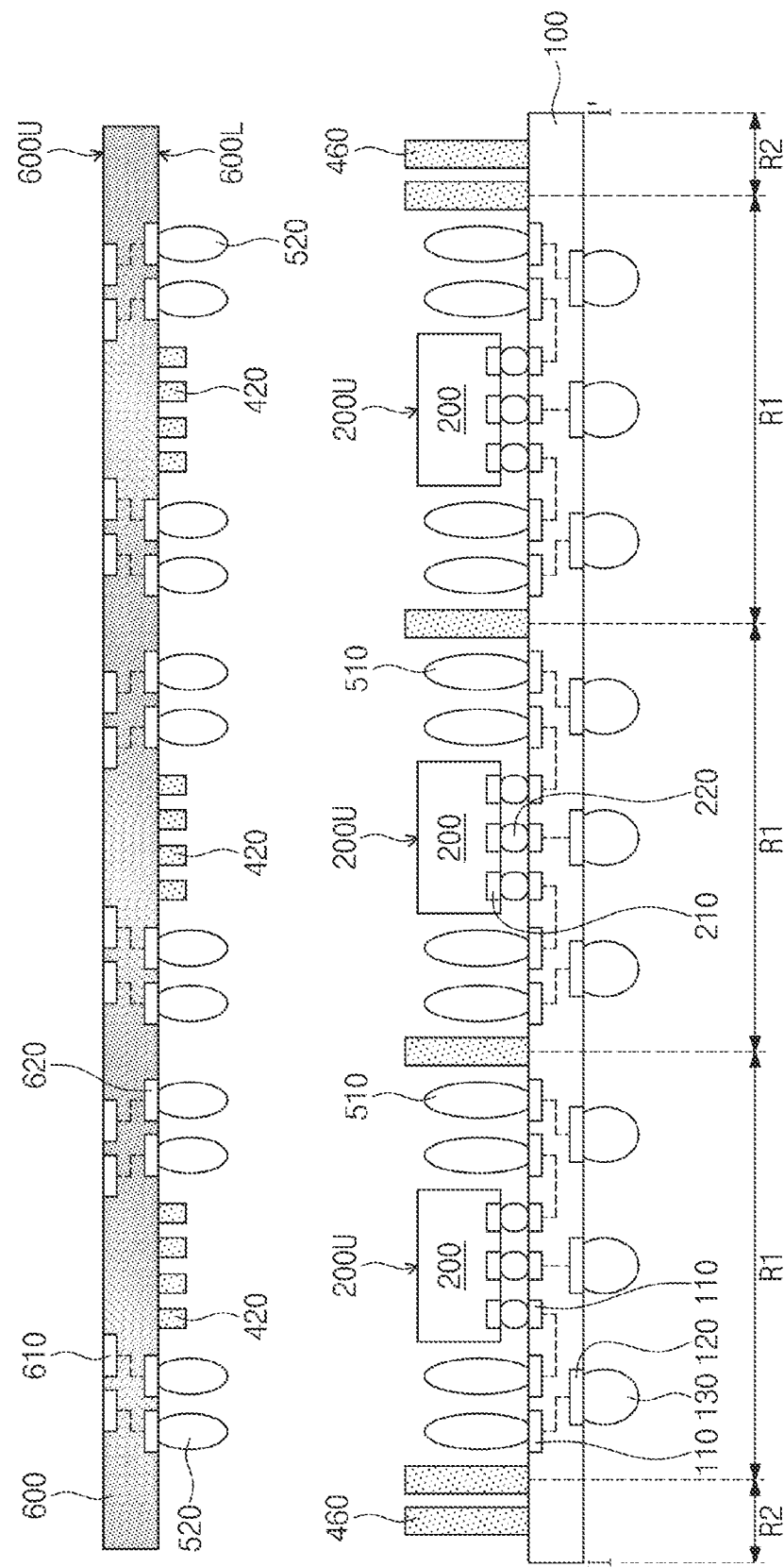

Referring to FIGS. 29 and 31, according to the present example embodiments, one second substrate 600 may be provided on the first substrate 100. The second substrate 600 may be an interposer substrate. The second substrate 600 may be overlapped with the mount regions R1 of the first substrate 100. The upper solder balls 520 may be provided on the lower surface 600L of the second substrate 600. The second substrate 600 may be provided on the first substrate 100 in such a way that the upper solder balls 520 are aligned to the lower solder balls 510, respectively. The bumps 420 may be provided on the lower surface 600L of the second substrate 600. The bumps 420 may be provided to face the upper surface 200U of each of the first semiconductor chips 200.

Figure 32:
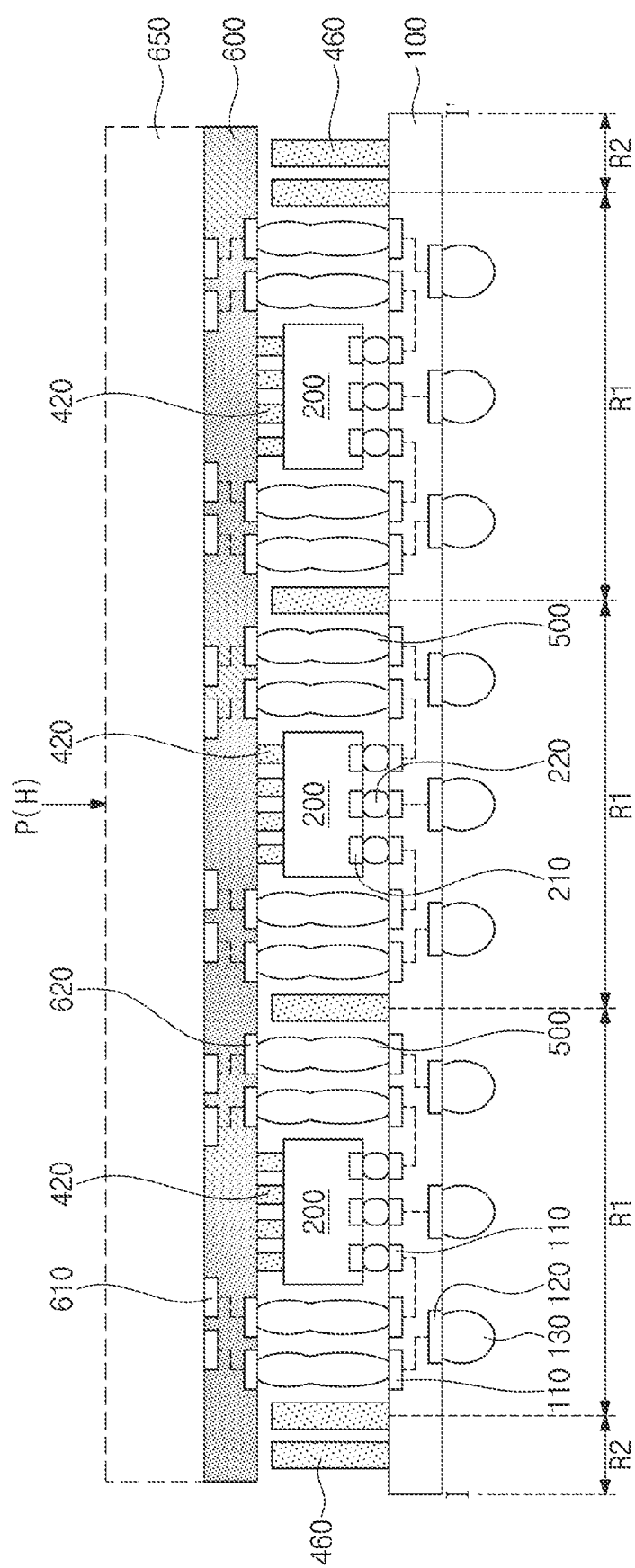

Referring to FIGS. 29 and 32, the second substrate 600 may be downwardly moved toward the mount regions R1 of the first substrate 100. The pressure P may be exerted on the second substrate 600 to allow the upper solder balls 520 to be in close contact with the lower solder balls 510. During the downward motion of the second substrate 600, the bumps 420 and the supporting patterns 460 may support the second substrates 600. According to the present example embodiments, the supporting patterns 460 may support the second substrate 600 to allow the second substrate 600 to be uniformly spaced apart from the first substrate 100 by a specific distance. Thus, even when a relatively large pressure P is exerted on the second substrate 600, it may be possible to prevent an edge region of the second substrate 600 from being bent toward the first substrate 100. As the upper solder balls 520 and the lower solder balls 510 form junctions, the solder structures 500 may be formed.

Figure 33:
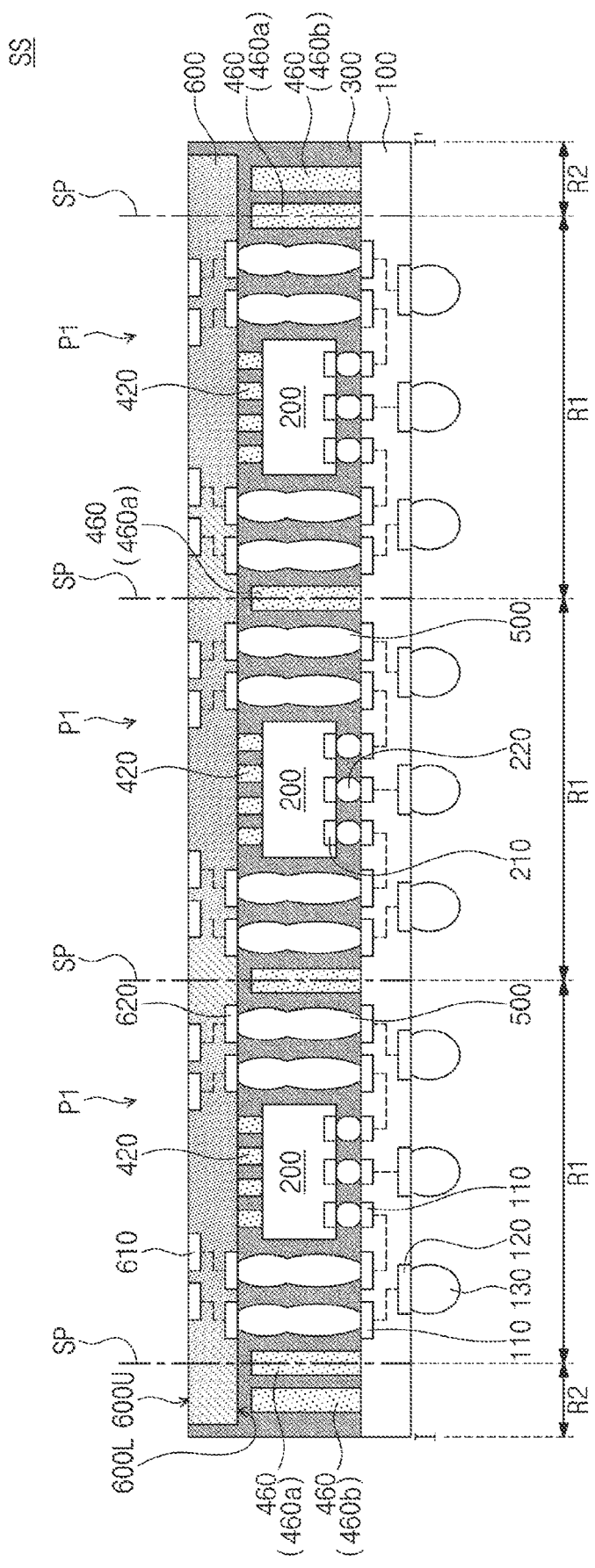

Referring to FIGS. 29 and 33, the first mold layer 300 may fill a gap region between the first substrate 100 and the second substrate 600.

As a result of the afore-described processes, the stack SS including a plurality of the first semiconductor packages P1 may be formed. A sawing process SP may be performed on the stack SS, and as a result, the stack SS may be divided into the plurality of the first semiconductor packages P1. The dummy region R2 of the first substrate 100 and structures on the dummy region R2 may be removed by the sawing process SP. As an example, the second supporting patterns 460b of the supporting patterns 460 may be removed by the sawing process SP. According to the present example embodiments, each of the first supporting patterns 460a of the supporting patterns 460 may be cut by the sawing process SP. As an example, the first supporting patterns 460a may include a first pattern, which is located on the border RB between the dummy region R2 and the mount region R1 and thus is at least partially removed by the sawing process SP. After the sawing process SP, at least a portion of the first pattern of the first supporting patterns 460a may remain on a corresponding one of the mount region R1 and may constitute a corresponding one of the first semiconductor package P1. In addition, the first supporting patterns 460a may include a second pattern, which is located on the border RB between the mount regions R1 and is cut by the sawing process SP. In this case, at least a portion of the second pattern of the first supporting patterns 460a may remain on a corresponding one of the mount regions R1 and may constitute a corresponding one of the first semiconductor packages P1.

Figure 34:
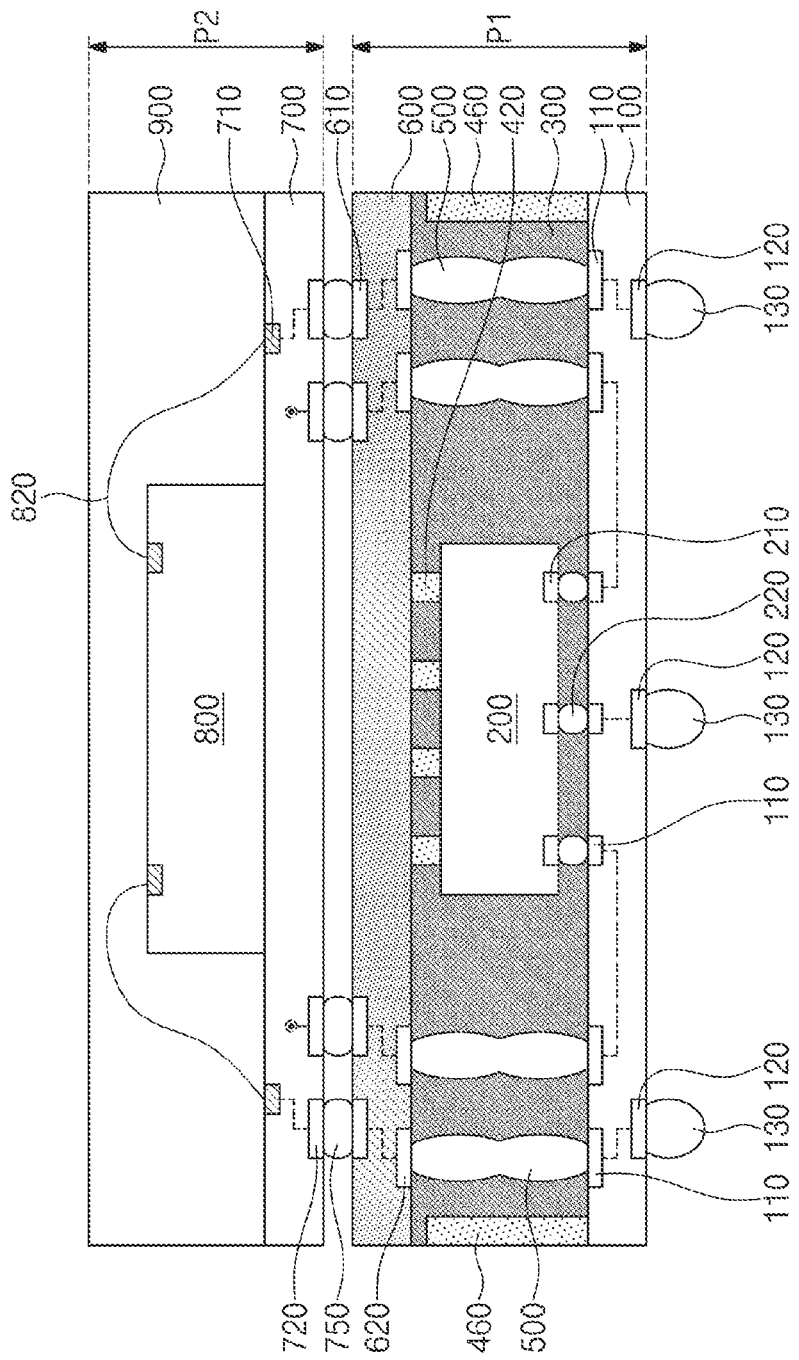
FIG. 34 is a sectional view illustrating a stack-type semiconductor package according to an example embodiment.

FIG. 34 is a sectional view illustrating a stack-type semiconductor package according to an example embodiment.

Referring to FIG. 34, the second semiconductor package P2 may be stacked on the first semiconductor package P1. The first semiconductor package P1 may be substantially the same as the first semiconductor package P1 described with reference to FIGS. 15 to 19. The second semiconductor package P2 may include the third substrate 700, the second semiconductor chip 800, and the second mold layer 900. The third substrate 700 may include the upper substrate pads 710 and the lower substrate pads 720. The upper substrate pads 710 and the lower substrate pads 720 may be provided on an upper surface and a lower surface, respectively, of the third substrate 700. The upper substrate pads 710 and the lower substrate pads 720 may be formed of or include a conductive material. Each of the lower substrate pads 720 may be connected to integrated circuits in the third substrate 700 or a corresponding one of the upper substrate pads 710. In FIG. 34, a dotted line is used to depict an internal interconnection line in the third substrate 700. As an example, the second semiconductor chip 800 may be electrically connected to the third substrate 700 through the bonding wire 820. As another example, the second semiconductor chip 800 may be mounted on the third substrate 700 in a flip-chip manner. The second semiconductor chip 800 may be configured to perform functions different from those of the first semiconductor chip 200. As an example, the second semiconductor chip 800 may be a memory chip. The connection terminals 750 may be provided between the second substrate 600 and the third substrate 700 and may be connected to the first pads 610 of the second substrate 600 and the lower substrate pads 720 of the third substrate 700. The second substrate 600 may be an interposer substrate. The second mold layer 900 may be provided on the third substrate 700 to seal the second semiconductor chip 800.

According to some example embodiments, a semiconductor package having a minimized number of defects and improved reliability and a method of fabricating the same may be provided.

While example embodiments have been particularly shown and described, it will be understood by one of ordinary skill in the art that variations in form and detail may be made therein without departing from the spirit and scope of the attached claims.

What is claimed is:

1. A semiconductor package comprising:
a first substrate;
a second substrate provided on the first substrate;
a first semiconductor chip provided between the first substrate and the second substrate;
solder structures provided between the first substrate and the second substrate and spaced apart from the first semiconductor chip, the solder structures electrically connecting the first substrate and the second substrate; and
supporting patterns provided between the first substrate and the second substrate,
wherein the solder structures are disposed between the first semiconductor chip and the supporting patterns,
wherein, in a plan view of the semiconductor package, the supporting patterns are spaced apart from each other around sides of the first semiconductor chip, and
wherein the solder structures comprise a conductive material, and the supporting patterns comprise an insulating material.

2. The semiconductor package of claim 1, wherein the supporting patterns are spaced apart from the first semiconductor chip and the solder structures.

3. The semiconductor package of claim 1, wherein the supporting patterns are arranged to surround the sides of the first semiconductor chip.

4. The semiconductor package of claim 1, further comprising a first mold layer provided between the first substrate and the second substrate and covering the first semiconductor chip,
wherein the first mold layer covers inner side surfaces of the supporting patterns.

5. The semiconductor package of claim 4, wherein the first mold layer extends between at least one of the supporting patterns and a lower surface of the second substrate.

6. The semiconductor package of claim 4, wherein at least one of the supporting patterns is in contact with a lower surface of the second substrate.

7. The semiconductor package of claim 4, wherein the inner side surfaces of the supporting patterns are inclined at an angle relative to an upper surface of the first substrate.

8. The semiconductor package of claim 4, wherein the supporting patterns has outer side surfaces opposite to the inner side surfaces, and
wherein the outer side surfaces of the supporting patterns are aligned with side surfaces of the first substrate.

9. The semiconductor package of claim 8, wherein the outer side surfaces of the supporting patterns are aligned with side surfaces of the second substrate.

10. The semiconductor package of claim 1, further comprising bumps disposed between the first semiconductor chip and the second substrate, wherein the bumps are spaced apart from each other, between the first semiconductor chip and the second substrate.

11. The semiconductor package of claim 10, wherein the bumps and the second substrate comprise a same material.

12. The semiconductor package of claim 10, wherein the bumps and the supporting patterns comprise a same material.

13. The semiconductor package of claim 10, wherein each of the bumps has a pillar shape and protrudes from an upper surface of the first semiconductor chip toward a lower surface of the second substrate.

14. A semiconductor package comprising:
a first substrate;
a second substrate provided on the first substrate;
a first semiconductor chip provided between the first substrate and the second substrate, the first semiconductor chip including chip pads on a lower surface thereof;
connecting portions provided between the first substrate and the lower surface of the first semiconductor chip, the connecting portions connected to the chip pads;
solder structures provided between the first substrate and the second substrate and spaced apart from the first semiconductor chip, the solder structures electrically connecting the first substrate and the second substrate; and
supporting patterns provided between the first substrate and the second substrate,
wherein the solder structures are disposed between the first semiconductor chip and the supporting patterns,
wherein, in a plan view of the semiconductor package, the supporting patterns are spaced apart from each other around sides of the first semiconductor chip, and
wherein the solder structures comprise a conductive material, and the supporting patterns comprise an insulating material.

15. The semiconductor package of claim 14, further comprising a first mold layer provided between the first substrate and the second substrate and covering the first semiconductor chip,
wherein the first mold layer covers inner side surfaces of the supporting patterns.

16. The semiconductor package of claim 15, wherein the first mold layer extends between at least one of the supporting patterns and a lower surface of the second substrate.

17. The semiconductor package of claim 15, wherein at least one of the supporting patterns is in contact with a lower surface of the second substrate.

18. The semiconductor package of claim 15, wherein the supporting patterns has outer side surfaces opposite to the inner side surfaces, and
wherein the outer side surfaces of the supporting patterns are aligned with side surfaces of the first substrate.

19. The semiconductor package of claim 1, wherein each of the supporting patterns comprises a pillar shape.

20. The semiconductor package of claim 4, wherein, in the plan view, adjacent ones of the supporting patterns around the sides of the first semiconductor chip are separated from each other by the first mold layer.

* * * * *